US012675903B2

(12) United States Patent
    Duquette

(10) Patent No.: US 12,675,903 B2
(45) Date of Patent: Jul. 7, 2026

(54) SYSTEM FOR GENERATING AN IMAGE DATASET FOR TRAINING AN ARTIFICIAL INTELLIGENCE MODEL FOR OBJECT RECOGNITION, AND METHOD OF USE THEREOF

(71) Applicant: Maya Heat Transfer Technologies Ltd., Westmount (CA)

(72) Inventor: Rémi Duquette, Montréal (CA)

( * ) Notice: Subject to any disclaimer, the term of this patent is extended or adjusted under 35 U.S.C. 154(b) by 109 days.

(21) Appl. No.: 18/529,292

(22) Filed: Dec. 5, 2023

(65) Prior Publication Data

US 2024/0242380 A1     Jul. 18, 2024

Related U.S. Application Data

(60) Provisional application No. 63/479,878, filed on Jan. 13, 2023.

(51) Int. Cl.
    *G06T 7/73*        (2017.01)
    *G06F 30/27*       (2020.01)
        (Continued)

(52) U.S. Cl.
    CPC ............... *G06T 7/74* (2017.01); *G06F 30/27* (2020.01); *G06T 15/06* (2013.01); *G06T 15/50* (2013.01);
        (Continued)

(58) Field of Classification Search
    CPC ........... G06T 7/74; G06T 15/06; G06T 15/50; G06T 2207/20081; G06T 2207/20084; G06F 30/27
    See application file for complete search history.

(56) References Cited

U.S. PATENT DOCUMENTS 6,522,312 B2 *  2/2003  Ohshima ................. A63F 13/00
                                                        463/2
7,948,485 B1 *  5/2011  Larsen .................... G06T 13/60
                                                        345/473
                        (Continued)

OTHER PUBLICATIONS

Sun, Baochen, Xingchao Peng, and Kate Saenko. "Generating large scale image datasets from 3D CAD models." CVPR 2015 Workshop on the future of datasets in vision. vol. 2, 2015. https://ai.bu.edu/pubs/cvpr2015_workshop_virtual_dataset.pdf.

(Continued)

*Primary Examiner* — Charles L Beard
(74) *Attorney, Agent, or Firm* — Anglehart et al.

(57)                ABSTRACT

A method of generating a synthetic image for producing a dataset of synthetic images for training an artificial intelligence model for object recognition; it includes generating a virtual space including a synthetic image background comprising one or more synthetic surfaces; spawning one or more virtual objects in the virtual space; simulating freefall and/or simulating environmental conditions of the one or more virtual objects resulting in a simulated impact between the one or more virtual objects and the one or more synthetic surfaces for determining the shape and position of the one or more virtual objects on the synthetic image background; and generating the synthetic image composed of the synthetic image background and the one or more virtual objects with the position of the one or more virtual objects on the synthetic image background determined from the simulated impact and/or simulated environmental conditions.

20 Claims, 18 Drawing Sheets

(51) Int. Cl.
*G06T 15/06* (2011.01)
*G06T 15/50* (2011.01)
(52) U.S. Cl.
CPC .............. *G06T 2207/20081* (2013.01); *G06T 2207/20084* (2013.01)

(56) References Cited

U.S. PATENT DOCUMENTS

| | | | | |
|---|---|---|---|---|
| 8,422,797 | B2 * | 4/2013 | Heisele | G06F 18/214 |
| | | | | 382/224 |
| 9,665,800 | B1 * | 5/2017 | Kuffner, Jr. | G06V 20/647 |
| 10,277,859 | B2 * | 4/2019 | Armeni | G06T 19/20 |
| 11,182,649 | B2 * | 11/2021 | Tremblay | G06T 15/00 |
| 11,257,272 | B2 * | 2/2022 | Rowell | G06T 1/0014 |
| 11,341,699 | B1 * | 5/2022 | Gottlieb | G06T 11/60 |
| 11,944,904 | B2 * | 4/2024 | Liang | A63F 13/57 |
| 12,037,013 | B1 * | 7/2024 | Linscott | G06N 20/00 |
| 12,272,019 | B1 * | 4/2025 | Iwanowski | G06T 7/75 |
| 2016/0314613 | A1 * | 10/2016 | Nowozin | G01S 7/497 |
| 2016/0342861 | A1 * | 11/2016 | Tuzel | G06F 18/214 |
| 2017/0355078 | A1 * | 12/2017 | Ur | G06V 10/751 |
| 2018/0232601 | A1 * | 8/2018 | Feng | G06T 7/0004 |
| 2018/0250821 | A1 * | 9/2018 | Shimodaira | B25J 9/1697 |
| 2020/0125880 | A1 * | 4/2020 | Wang | G06N 3/045 |
| 2020/0167606 | A1 * | 5/2020 | Wohlhart | B25J 9/161 |
| 2020/0388021 | A1 * | 12/2020 | Song | G06N 3/09 |
| 2021/0056247 | A1 * | 2/2021 | Audren | G06N 3/045 |
| 2021/0064122 | A1 * | 3/2021 | Fujinawa | G06T 19/006 |
| 2021/0103776 | A1 * | 4/2021 | Jiang | G06T 19/20 |
| 2021/0182664 | A1 * | 6/2021 | Kim | G06N 3/0895 |
| 2021/0197524 | A1 * | 7/2021 | Maroli | B32B 15/011 |
| 2021/0217144 | A1 * | 7/2021 | Snellgrove | G06T 5/77 |
| 2021/0295068 | A1 * | 9/2021 | Bergt | G06V 10/7784 |
| 2021/0327127 | A1 * | 10/2021 | Hinterstoisser | G06T 19/20 |
| 2022/0044441 | A1 * | 2/2022 | Kalra | G06V 10/82 |
| 2022/0083807 | A1 * | 3/2022 | Zhang | G06F 18/214 |
| 2022/0215266 | A1 * | 7/2022 | Venkataraman | G06N 3/045 |
| 2022/0237336 | A1 * | 7/2022 | Zhao | G06F 30/27 |
| 2022/0343537 | A1 * | 10/2022 | Taamazyan | G06V 10/82 |
| 2023/0078763 | A1 * | 3/2023 | Hata | G06T 5/80 |
| | | | | 382/159 |
| 2023/0144893 | A1 * | 5/2023 | Chan | G06T 17/00 |
| | | | | 345/419 |
| 2023/0169677 | A1 * | 6/2023 | Llic | G06T 7/73 |
| | | | | 382/103 |
| 2023/0234231 | A1 * | 7/2023 | Dong | B25J 9/1689 |
| | | | | 700/248 |
| 2023/0245269 | A1 * | 8/2023 | Trott | G06T 3/4046 |
| | | | | 382/162 |
| 2023/0245364 | A1 * | 8/2023 | Chen | G06T 13/20 |
| | | | | 345/473 |
| 2023/0339502 | A1 * | 10/2023 | Chi-Johnston | G06N 20/00 |
| 2023/0339519 | A1 * | 10/2023 | Chi-Johnston | B60W 60/0059 |
| 2023/0419532 | A1 * | 12/2023 | Strunz | G06N 3/084 |
| 2024/0037925 | A1 * | 2/2024 | Lim | B33Y 40/20 |
| 2024/0054268 | A1 * | 2/2024 | Behandish | B22F 10/85 |
| 2024/0070896 | A1 * | 2/2024 | Hayashi | G06V 10/44 |
| 2024/0104431 | A1 * | 3/2024 | Choi | G06V 10/10 |
| 2024/0135618 | A1 * | 4/2024 | Zhang | G06T 13/40 |
| 2024/0161427 | A1 * | 5/2024 | Biehl | A63F 13/211 |
| 2024/0173855 | A1 * | 5/2024 | Thon | G06F 30/27 |
| 2024/0193845 | A1 * | 6/2024 | Hwang | G06T 7/194 |
| 2024/0221309 | A1 * | 7/2024 | Chai | G06T 17/00 |
| 2024/0303773 | A1 * | 9/2024 | Sartor | G06T 5/50 |
| 2024/0370223 | A1 * | 11/2024 | Varekamp | G06F 3/16 |
| 2025/0054265 | A1 * | 2/2025 | Zhu | G06V 10/25 |
| 2025/0054270 | A1 * | 2/2025 | Yamauchi | G06T 7/0008 |
| 2025/0061591 | A1 * | 2/2025 | Krupani | G06T 7/248 |
| 2025/0077765 | A1 * | 3/2025 | Xu | G06F 16/24578 |
| 2025/0173891 | A1 * | 5/2025 | Manzur | G06T 7/70 |
| 2025/0181969 | A1 * | 6/2025 | Wen | G06N 20/00 |

OTHER PUBLICATIONS

Sooyoung, C., et al. "How to generate image dataset based on 3D model and deep learning method." Int. J. Eng. Technol 7 (2018): 221-225. https://www.sciencepubco.com/index.php/ijet/article/download/18969/8694.

Peng, Xingchao, et al. "Learning deep object detectors from 3d models." Proceedings of the IEEE international conference on computer vision. 2015. https://arxiv.org/pdf/1412.7122.pdf.

Planche, Benjamin, et al. "Depthsynth: Real-time realistic synthetic data generation from cad models for 2.5 d recognition." 2017 International Conference on 3D Vision (3DV). IEEE, 2017. https://arxiv.org/pdf/1702.08558.pdf.

Martinez-Gonzalez, Pablo, et al. "Unrealrox: an extremely photo-realistic virtual reality environment for robotics simulations and synthetic data generation." Virtual Reality 24.2 (2020): 271-288. https://arxiv.org/pdf/1810.06936.pdf.

Martinez-Gonzalez, Pablo, et al. "UnrealROX+: An Improved Tool for Acquiring Synthetic Data from Virtual 3D Environments." 2021 International Joint Conference on Neural Networks (IJCNN). IEEE, 2021. https://arxiv.org/pdf/2104.11776.pdf.

Borkman, Steve, et al. "Unity perception: Generate synthetic data for computer vision." arXiv preprint arXiv:2107.04259 (2021). https://arxiv.org/pdf/2107.04259.pdf.

Wang, Qi, et al. "Learning from synthetic data for crowd counting in the wild." Proceedings of the IEEE/CVF conference on computer vision and pattern recognition. 2019. https://openaccess.thecvf.com/content_CVPR_2019/papers/Wang_Learning_From_Synthetic_Data_for_Crowd_Counting_in_the_Wild_CVPR_2019_paper.pdf.

Mu, Jiteng, et al. "Learning from synthetic animals." Proceedings of the IEEE/CVF Conference on Computer Vision and Pattern Recognition. 2020. https://openaccess.thecvf.com/content_CVPR_2020/papers/Mu_Learning_From_Synthetic_Animals_CVPR_2020_paper.pdf.

Ros, German, et al. "The synthia dataset: A large collection of synthetic images for semantic segmentation of urban scenes." Proceedings of the IEEE conference on computer vision and pattern recognition. 2016. https://www.cv-foundation.org/openaccess/content_cvpr_2016/papers/Ros_The_SYNTHIA_Dataset_CVPR_2016_paper.pdf.

YouTube video source: Training AI with 3D Rendered Images https://www.youtube.com/watch?v=WL1yK7RtHT4. Posted Jun. 8, 2020. Retrieved Oct. 27, 2022.

YouTube video source: GCC dataset Collector and Labeler (GCC-CL): A generater of crowd scenes. https://www.youtube.com/watch?v=Hvl7xWklueo. Posted Mar. 5, 2019. Retrieved Oct. 27, 2022.

* cited by examiner

700

Retrieving a synthetic image background — 710

Generating the synthetic image background — 720

Retrieving a synthetic surface — 730

Generating a synthetic surface — 740

Setting a material texture for the synthetic surface — 750

800

SYSTEM FOR GENERATING AN IMAGE DATASET FOR TRAINING AN ARTIFICIAL INTELLIGENCE MODEL FOR OBJECT RECOGNITION, AND METHOD OF USE THEREOF

The present application claims priority from U.S. provisional patent application No. 63/479,878 filed on Jan. 13, 2023, incorporated herein by reference.

TECHNICAL FIELD

Background

Manual labeling of images for artificial intelligence model training remains one of the main ways to label enough images to create a suitably large enough dataset. However, this method, generating a large enough dataset with images showing enough variance, requires manually marking the objects with labels, imposing important time constraints. Existing techniques involve the augmentation of an existing real dataset by creating synthetic image data by mathematically manipulating the real images (taking real images and operating various operations such as mirroring, blurring, changing color tones, adding random noise, etc.) In some other examples, the creation of synthetic images using computer generated data has evolved but do not take into account the environmental physical phenomenon making current synthetic data close but not photo-realistic when compared to real images.

SUMMARY

The present disclosure relates to systems and methods for generating a dataset of synthetic images for training an artificial intelligence model to perform object recognition while reducing an amount of human intervention required to generate the dataset of synthetic images. Moreover, the dataset of synthetic images is generated while taking into account real-world phenomena such as gravity (affecting a position of the virtual objects when under the impact of gravity) and/or environmental conditions (e.g. humidity, temperature, air velocity, pressure, water flow, turbulence intensity level, etc.) and/or different lighting conditions.

A synthetic image is generated by simulating a freefall of the one or more virtual objects in a virtual space having a synthetic image background. The freefall is performed through a simulation of gravity. The positioning of the one or more virtual objects on the synthetic image background may take into account properties of the synthetic image background and of the one or more virtual objects. For instance, the rigidity of the surface of the synthetic image background, based on a selected material of a surface of the synthetic image background, as well as a selected material of the virtual object, and a center of mass of the virtual object and/or a weight distribution of the virtual object, can affect the positioning of the virtual object following the simulated freefall.

Following the simulated freefall (e.g. once the one or more virtual objects have immobilized in the virtual space in natural and photo-realistic positions along with, in some instances, deformation of other background virtual objects or other virtual objects based on a weight value of the virtual object having undergone the simulated freefall) and/or the other relevant simulation of other environmental conditions (e.g. trajectories of virtual objects may be affected by air movement or water movement or virtual objects may deform and be elongated under different temperature or humidity conditions), a generating of the synthetic image (i.e. a capture of the image from one or more camera views) is performed.

A dataset of synthetic images is generated by repeating the generating of the synthetic images following a change of one or more of:
  properties of the synthetic image background;
  a number and identity of the one or more virtual objects;
  properties of the one or more virtual objects;
  position(s) of the one or more virtual objects prior to freefall;
  environmental conditions (e.g. temperature, humidity, etc.)
  lighting conditions (e.g. diffuse and/or direct lighting, reflections from other virtual objects and/or background virtual objects, etc.)
  etc.

A broad aspect is a method of generating a synthetic image for producing a dataset of synthetic images for training an artificial intelligence model for object recognition. The method includes generating a virtual space including a synthetic image background comprising one or more synthetic surfaces; spawning one or more virtual objects in the virtual space; simulating a freefall of the one or more virtual objects resulting in a simulated impact between the one or more virtual objects and the one or more synthetic surfaces for determining a position of the one or more virtual objects on the synthetic image background; and generating the synthetic image composed of the synthetic image background and the one or more virtual objects with the position of the one or more virtual objects on the synthetic image background determined from the simulated impact.

In some embodiments, the one or more virtual objects may include one or more physical properties, and wherein the outcome of the simulated impact may further account for the one or more physical properties of the one or more virtual objects.

In some embodiments, the one or more physical properties of the one or more virtual objects may include one or more of: a type of object; an object dimension; an object material; a center of mass of the object; and an object weight.

In some embodiments, the spawning may include spawning a plurality of virtual objects in a hidden mode, wherein the plurality of virtual objects is concealed in the virtual space; selecting the one or more virtual objects from the plurality of virtual objects; and revealing the one or more virtual objects for the simulation.

In some embodiments, the plurality of virtual objects may form an object map.

In some embodiments, the method may include defining an object zone in the virtual space, where the one or more virtual objects are to be positioned in the object zone following the simulated impact.

In some embodiments, the method may include removing virtual objects of the one or more virtual objects that are outside of the object zone following the simulated impact or subsequent displacement from the surface of the object zone.

In some embodiments, the object zone may encompass a surface with a virtual material with physical properties set to emulate a real equivalent of the virtual material.

In some embodiments, the number of virtual objects of the one or more virtual objects may be determined from dimensions of the object zone.

In some embodiments, the spawning may include offsetting the one or more virtual objects from the object zone such that the one or more virtual objects spawn over the object zone while the virtual objects of the one or more virtual objects are not in contact prior to the simulating.

In some embodiments, the method may include applying lighting with ray tracing to the one or more virtual objects and the synthetic object background.

In some embodiments, the lighting may be a first lighting, and the method may further include applying a second static lighting above an area of the virtual space where the one or more virtual objects are spawned.

In some embodiments, an initial orientation of each of the virtual objects of the one or more virtual objects may be determined randomly prior to the simulating.

In some embodiments, the generating of the synthetic image may be taken at a viewing angle of a virtual camera object, wherein the position of the virtual camera object in the virtual space is determined randomly.

In some embodiments, the method may further include generating a masked image corresponding to the synthetic image from which the coordinates of a rectangular box containing the object is registered.

In some embodiments, the one or more synthetic surfaces may each include a material texture having one or more physical properties and the simulated impact is generated as a function of at least the one or more physical properties of the one or more synthetic surfaces.

In some embodiments, the method may further include simulating environmental conditions affecting the position or size of the one or more virtual objects.

In some embodiments, the environmental conditions may include one or more of a humidity level; air flow profile; pressure level; and a temperature affecting at least one of a state and a size of the one or more virtual objects.

Another broad aspect is method of generating a dataset of synthetic images for training an artificial intelligence model for object recognition, comprising repeating the method as defined herein for each synthetic image of the dataset of synthetic images, wherein one or more of the following is varied to generate different synthetic images forming the dataset of synthetic images lighting with ray tracing to the one or more virtual objects and the synthetic object background; a viewing angle of a virtual camera related to the perspective taken for the generated synthetic image; the material texture of the one or more synthetic surfaces; and one or more types of the one or more virtual objects.

In some embodiments, the lighting with ray tracing to the one or more virtual objects and the synthetic object background may be varied to generate different synthetic images forming the dataset of synthetic images.

In some embodiments, the viewing angle of a virtual camera related to the perspective taken for the generated synthetic image may be varied to generate different synthetic images forming the dataset of synthetic images.

In some embodiments, the material texture of the one or more synthetic surfaces may be varied to generate different synthetic images forming the dataset of synthetic images.

In some embodiments, the one or more types of the one or more virtual objects may be varied to generate different synthetic images forming the dataset of synthetic images.

Another broad aspect is non-transitory storage medium having stored thereon a synthetic image for training an artificial intelligence model for object recognition generated by performing the method as defined herein.

Another broad aspect is non-transitory storage medium having stored thereon a dataset of synthetic images for training an artificial intelligence model for object recognition generated by performing the method as defined herein.

Another broad aspect is a method of training an artificial intelligence model for object recognition using the dataset of synthetic images as described herein, including receiving the dataset of synthetic images; causing an identification and location of one or more virtual objects in a synthetic image of the dataset of synthetic images; and comparing the synthetic image with the one or more identified virtual objects to a ground truth to calculate a loss that is back-propagated through the artificial intelligence model to train the artificial intelligence model.

Another broad aspect is non-transitory storage medium having stored thereon an artificial intelligence model that is trained using the method as defined herein.

In some embodiments, the artificial intelligence model may be trained to identify equipment in a real image captured by a camera.

Another broad aspect is a system configured to generate a synthetic image for producing a dataset of synthetic images for training an artificial intelligence model for object recognition, including a processor; memory further including program code that, when executed by the processor, causes the processor to: generate a virtual space including a synthetic image background comprising one or more synthetic surfaces; spawn one or more virtual objects in the virtual space; simulate a freefall of the one or more virtual objects resulting in a simulated impact between the one or more virtual objects and the one or more synthetic surfaces for determining a position the one or more virtual objects on the synthetic image background; and generate the synthetic image composed of the synthetic image background and the one or more virtual objects with the position of the one or more virtual objects on the synthetic image background determined from the simulated impact.

In some embodiments, the one or more virtual objects may include one or more physical properties, and wherein the outcome of the simulated impact further accounts for the one or more physical properties of the one or more virtual objects.

In some embodiments, the one or more physical properties of the one or more virtual objects may include one or more of a type of object; an object dimension; an object material; a center of mass of the object; and an object weight.

In some embodiments, the spawning may include spawning a plurality of virtual objects in a hidden mode, wherein the plurality of virtual objects is concealed in the virtual space; selecting the one or more virtual objects from the plurality of virtual objects; and revealing the one or more virtual objects for the simulation.

In some embodiments, the plurality of virtual objects may form an object map.

In some embodiments, the memory may further include program code for, when executed by the processor, causing the processor to define an object zone in the virtual space, where the one or more virtual objects are to be positioned in the object zone following the simulated impact.

In some embodiments, the memory may further include program code for, when executed by the processor, causing the processor to remove virtual objects of the one or more virtual objects that are outside of the object zone following the simulated impact or subsequent displacement from the surface of the object zone.

In some embodiments, the object zone may encompass a surface with a virtual material with physical properties set to emulate a real equivalent of the virtual material.

In some embodiments, the number of virtual objects of the one or more virtual objects may be determined from dimensions of the object zone.

In some embodiments, the spawning may include offsetting the one or more virtual objects from the object zone such that the one or more virtual objects spawn over the object zone while the virtual objects of the one or more virtual objects are not in contact prior to the simulating.

In some embodiments, the memory may further include program code for, when executed by the processor, causing the processor to apply lighting with ray tracing to the one or more virtual objects and the synthetic object background.

In some embodiments, the lighting may be a first lighting, and the memory may further include program code for, when executed by the processor, causing the processor to apply a second static lighting above an area of the virtual space where the one or more virtual objects are spawned.

In some embodiments, an initial orientation of each of the virtual objects of the one or more virtual objects may be determined randomly prior to the simulating.

In some embodiments, the generating of the synthetic image may be taken at a viewing angle of a virtual camera object, wherein the position of the virtual camera object in the virtual space is determined randomly.

In some embodiments, the memory may further include program code for, when executed by the processor, causing the processor to generate a masked image corresponding to the synthetic image from which the coordinates of a rectangular box containing the object is registered.

In some embodiments, the one or more synthetic surfaces may each include a material texture having one or more physical properties and the simulated impact may be generated as a function of at least the one or more physical properties of the one or more synthetic surfaces.

In some embodiments, the memory may further include program code for, when executed by the processor, causing the processor to simulate environmental conditions affecting the position or size of the one or more virtual objects.

In some embodiments, the environmental conditions may include one or more of a humidity level; air flow profile; pressure level; and a temperature affecting at least one of a state and a size of the one or more virtual objects.

Another broad aspect is non-transitory computer-readable medium having stored thereon program instructions for training an artificial intelligence model for object recognition, the program instructions executable by a processing unit for generating a virtual space including a synthetic image background comprising one or more synthetic surfaces; spawning one or more virtual objects in the virtual space; simulating a freefall of the one or more virtual objects resulting in a simulated impact between the one or more virtual objects and the one or more synthetic surfaces (including environmental simulation effects) for determining a position the one or more virtual objects on the synthetic image background; and generating the synthetic image composed of the synthetic image background and the one or more virtual objects with the position of the one or more virtual objects on the synthetic image background determined from the simulated impact and environmental condition simulation.

In some embodiments, the one or more virtual objects may include one or more physical properties, and wherein the outcome of the simulated impact may further account for the one or more physical properties of the one or more virtual objects.

In some embodiments, the one or more physical properties of the one or more virtual objects may include one or more of a type of object; an object dimension; an object material; a center of mass of the object; and an object weight.

In some embodiments, the spawning may include spawning a plurality of virtual objects in a hidden mode, wherein the plurality of virtual objects is concealed in the virtual space; selecting the one or more virtual objects from the plurality of virtual objects; and revealing the one or more virtual objects for the simulation.

In some embodiments, the plurality of virtual objects may form an object map.

In some embodiments, the program instructions may be further executable by the processing unit for defining an object zone in the virtual space, where the one or more virtual objects are to be positioned in the object zone following the simulated impact.

In some embodiments, the program instructions may be further executable by the processing unit for removing virtual objects of the one or more virtual objects that are outside of the object zone following the simulated impact or subsequent displacement from the surface of the object zone.

In some embodiments, the object zone may encompass a surface with a virtual material with physical properties set to emulate a real equivalent of the virtual material.

In some embodiments, the number of virtual objects of the one or more virtual objects may be determined from dimensions of the object zone.

In some embodiments, the spawning may include offsetting the one or more virtual objects from the object zone such that the one or more virtual objects spawn over the object zone while the virtual objects of the one or more virtual objects are not in contact prior to the simulating.

In some embodiments, the program instructions may be further executable by the processing unit for applying lighting with ray tracing to the one or more virtual objects and the synthetic object background.

In some embodiments, the lighting may be a first lighting, and wherein the program instructions may be further executable by the processing unit for applying a second static lighting above an area of the virtual space where the one or more virtual objects are spawned.

In some embodiments, an initial orientation of each of the virtual objects of the one or more virtual objects may be determined randomly prior to the simulating.

In some embodiments, the generating of the synthetic image may be taken at a viewing angle of a virtual camera object, wherein the position of the virtual camera object in the virtual space may be determined randomly.

In some embodiments, the program instructions may be further executable by the processing unit for generating a masked image corresponding to the synthetic image from which the coordinates of a rectangular box containing the object is registered.

In some embodiments, the one or more synthetic surfaces may each comprise a material texture having one or more physical properties and the simulated impact is generated as a function of at least the one or more physical properties of the one or more synthetic surfaces.

In some embodiments, the program instructions may be further executable by the processing unit for simulating environmental conditions affecting the position or size of the one or more virtual objects.

In some embodiments, the environmental conditions may include one or more of a humidity level; air flow profile; pressure level; and a temperature affecting at least one of a state and a size of the one or more virtual objects.

Another broad aspect is a method of generating a synthetic image for producing a dataset of synthetic images for training an artificial intelligence model for object recognition, comprising generating a virtual space including a synthetic image background comprising one or more synthetic surfaces; spawning one or more virtual objects in the virtual space; positioning the one or more virtual objects on the synthetic image background; simulating one or more environmental conditions affecting at least one of a shape and a physical property of at least one of the one or more virtual objects; and generating the synthetic image composed of the synthetic image background and the one or more virtual objects with the at least one of a shape and a physical property of the one or more virtual objects on the synthetic image background affected by the one or more simulated environmental conditions.

Another broad aspect is a system for generating a synthetic image for producing a dataset of synthetic images for training an artificial intelligence model for object recognition. The system comprises a processor and memory storing program code that, when executed by the processor, cause the processor to generate a virtual space including a synthetic image background comprising one or more synthetic surfaces; spawn one or more virtual objects in the virtual space; position the one or more virtual objects on the synthetic image background; simulate one or more environmental conditions affecting at least one of a shape and a physical property of at least one of the one or more virtual objects; and generate the synthetic image composed of the synthetic image background and the one or more virtual objects with the at least one of a shape and a physical property of the one or more virtual objects on the synthetic image background affected by the one or more simulated environmental conditions.

Another broad aspect is non-transitory computer-readable medium having stored thereon program instructions for training an artificial intelligence model for object recognition, the program instructions executable by a processing unit for generating a virtual space including a synthetic image background comprising one or more synthetic surfaces; spawning one or more virtual objects in the virtual space; positioning the one or more virtual objects on the synthetic image background; simulating one or more environmental conditions affecting at least one of a shape and a physical property of at least one of the one or more virtual objects; and generating the synthetic image composed of the synthetic image background and the one or more virtual objects with the at least one of a shape and a physical property of the one or more virtual objects on the synthetic image background affected by the one or more simulated environmental conditions.

BRIEF DESCRIPTION OF THE DRAWINGS

The invention will be better understood by way of the following detailed description of embodiments of the invention with reference to the appended drawings, in which.

8

Figure 3A:
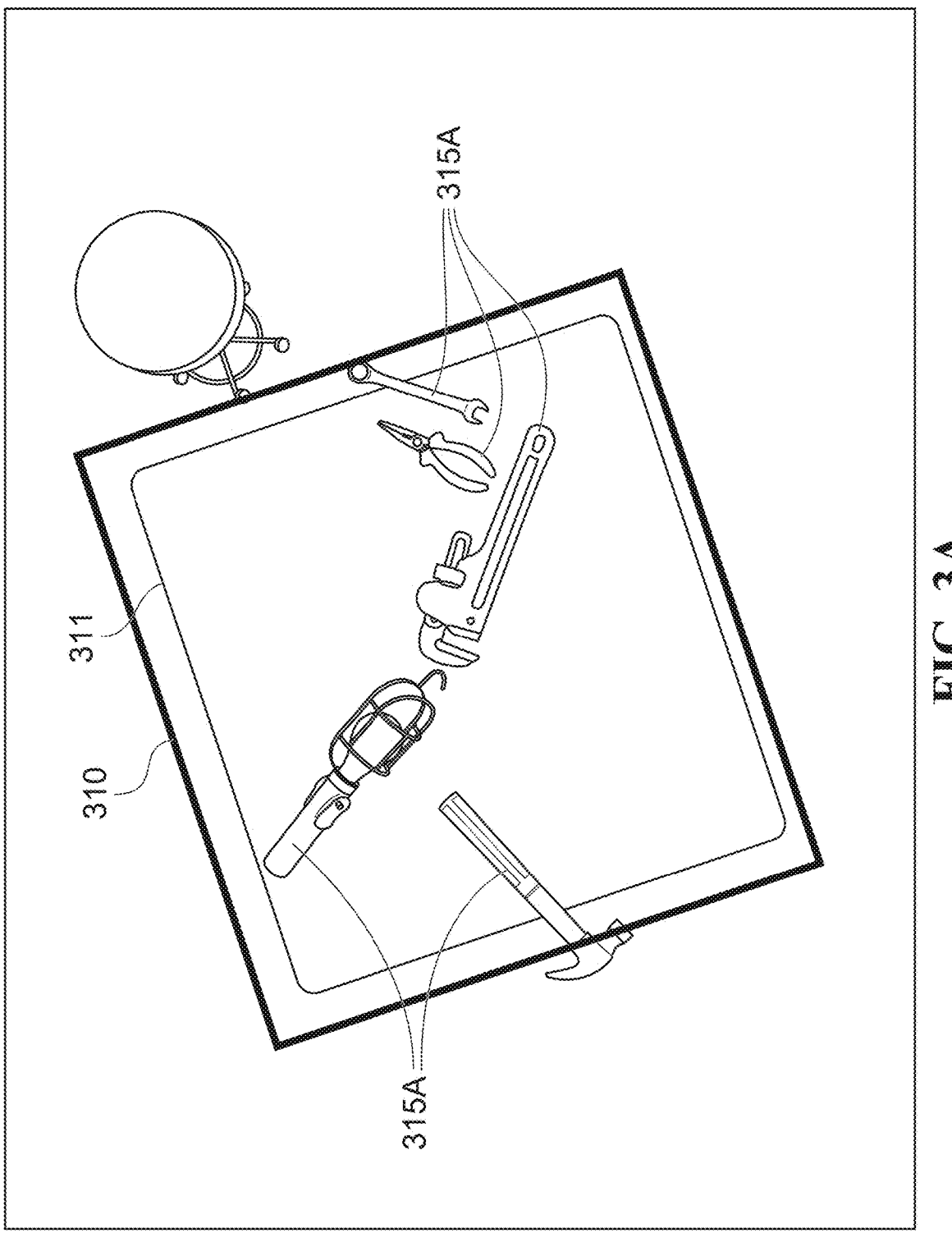
FIG. 3A is an image of a first state of virtual objects in a virtual space during a simulated freefall.
Figure 3B:
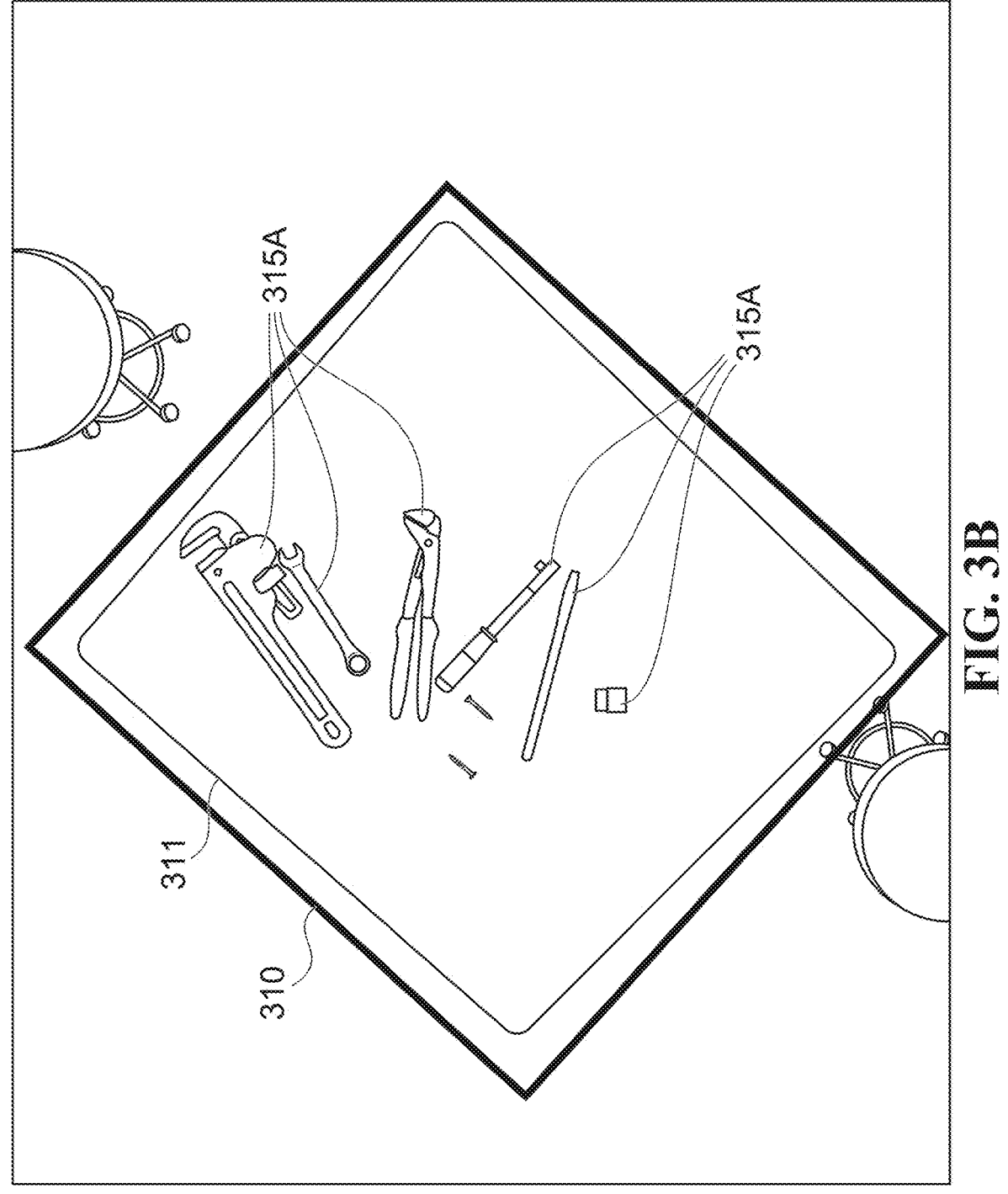
FIG. 3B is an image of positioned virtual objects in a virtual space following a simulated freefall.
Figure 3C:
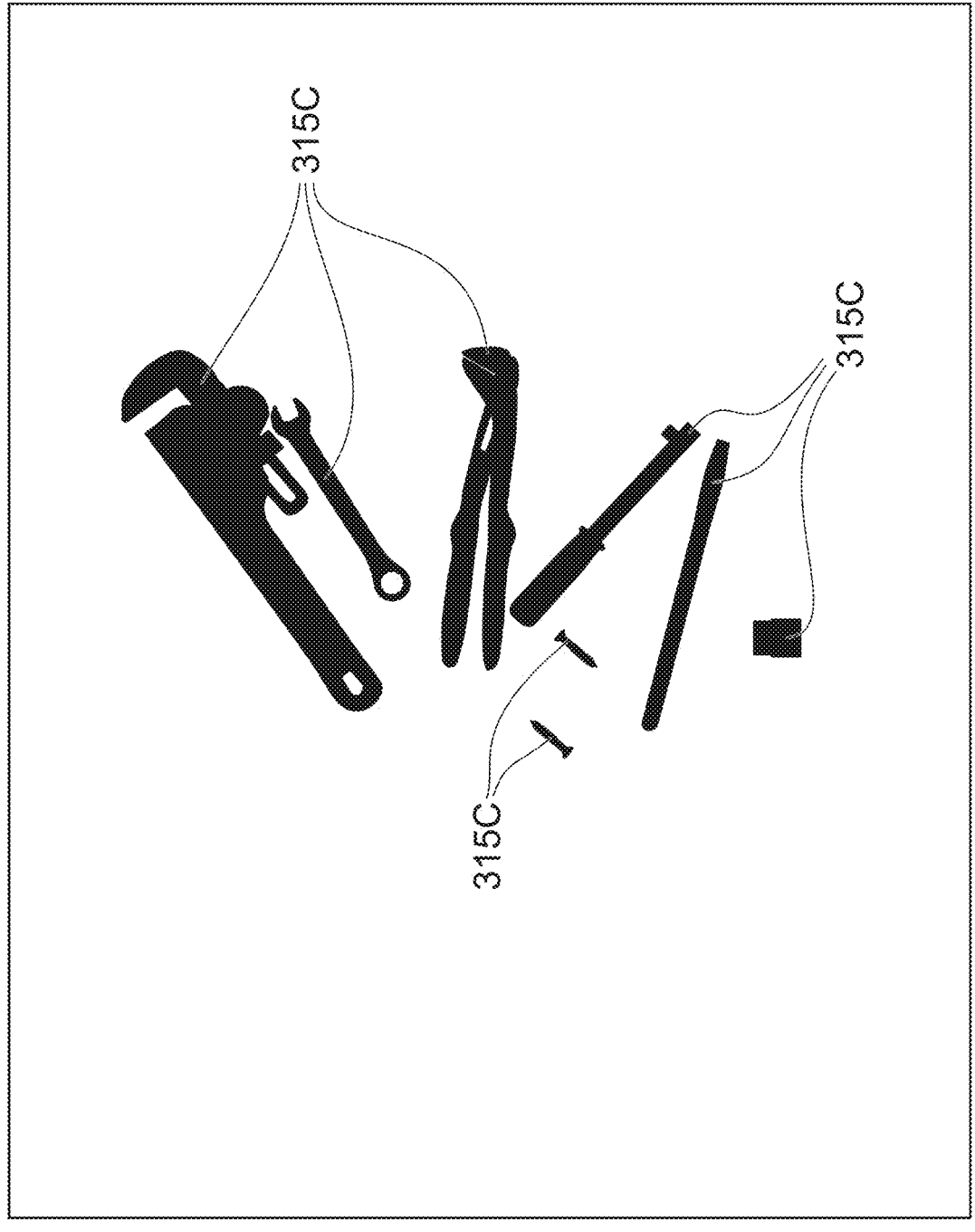
Figure 4A:
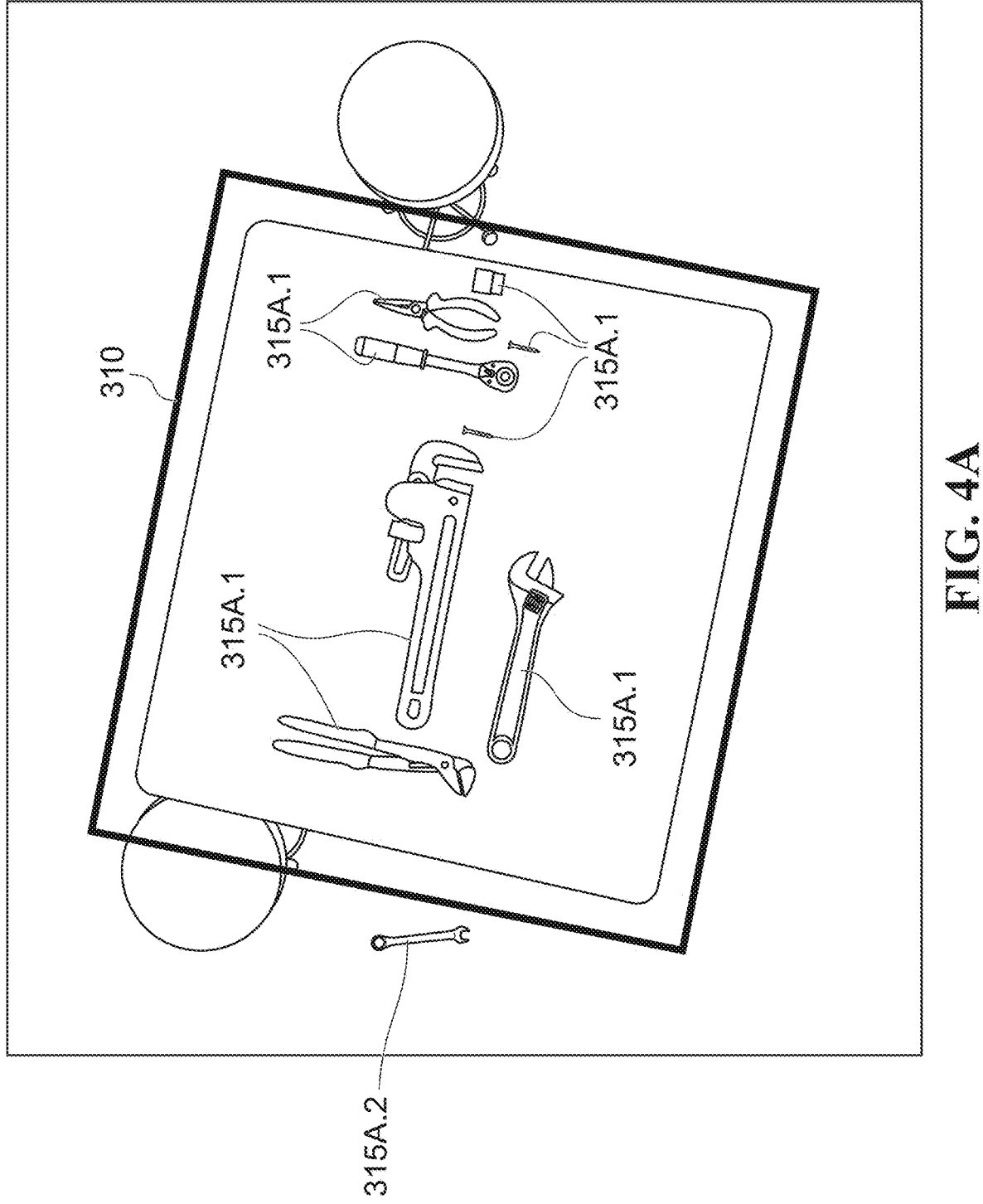
Figure 4B:
Figure 4C:
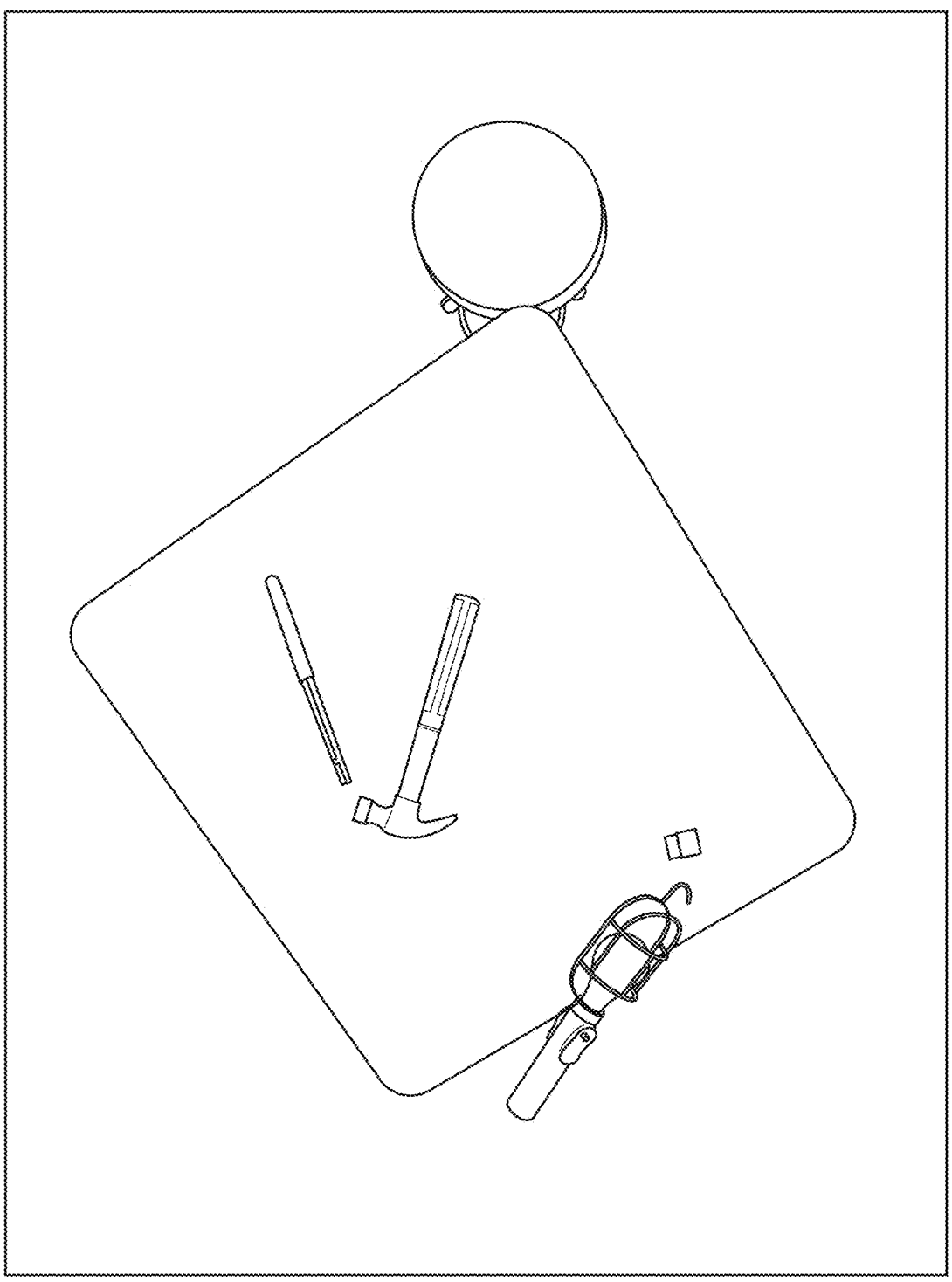
Figure 5A:
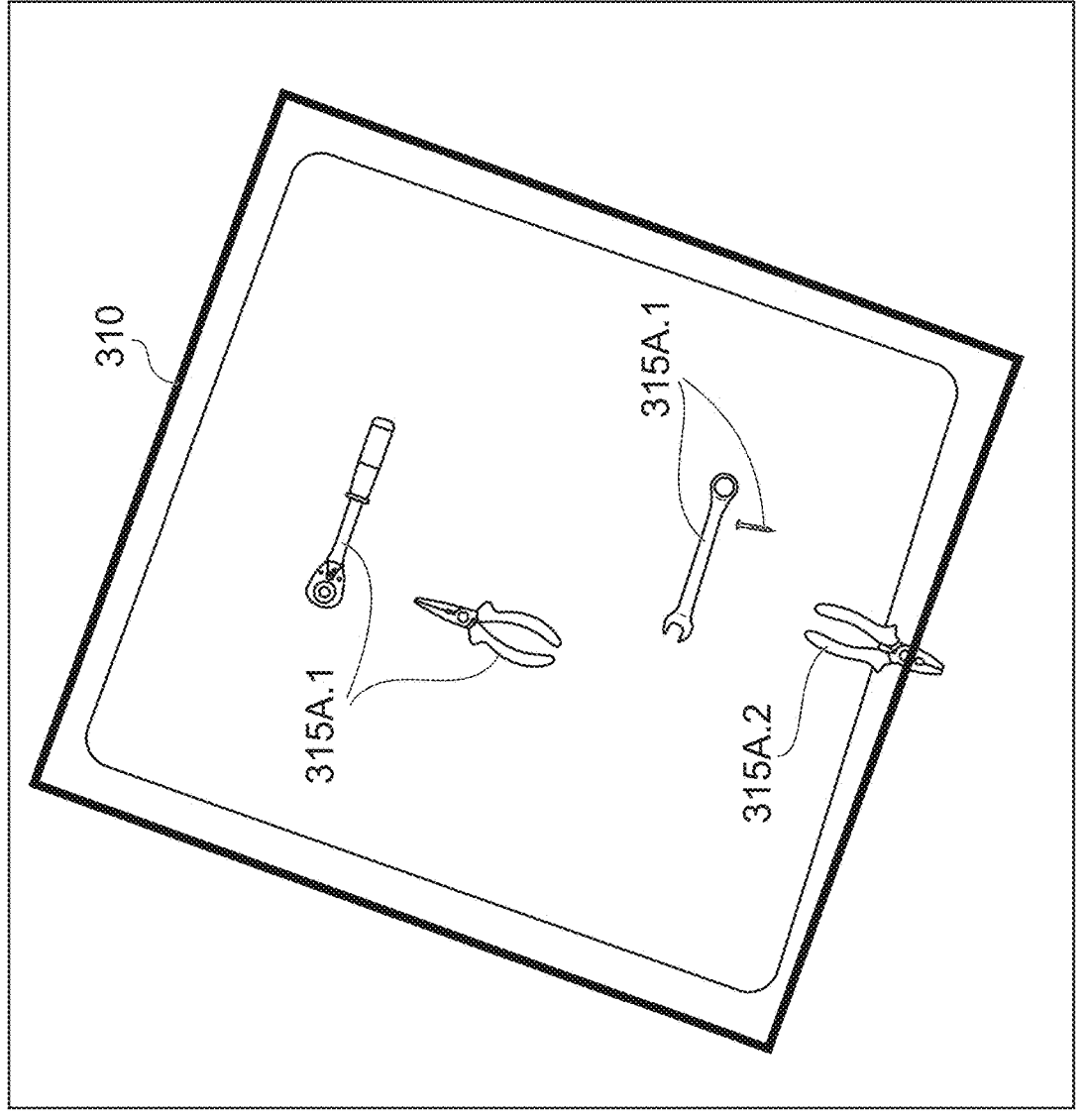
Figure 5B:
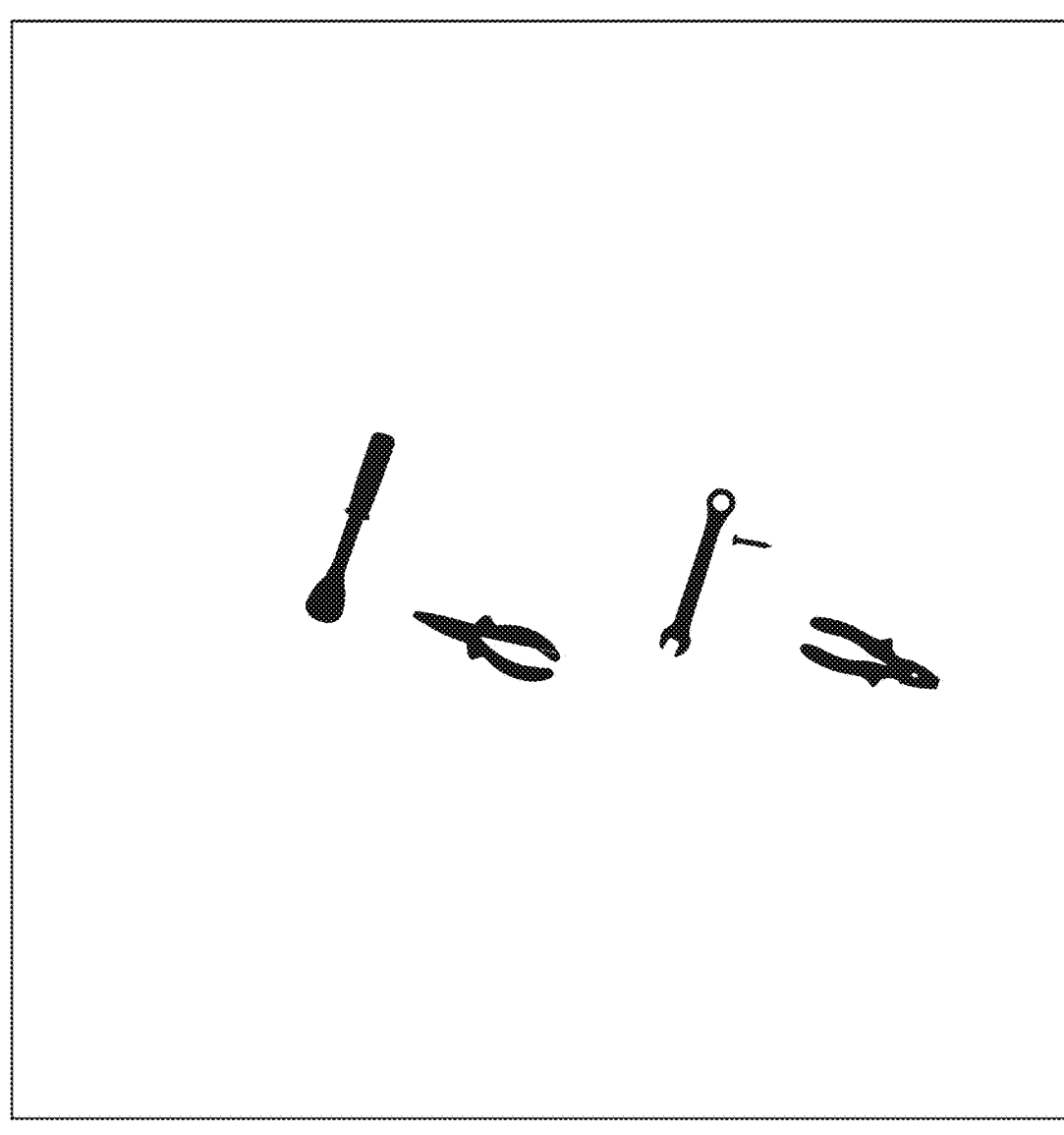
Figure 5C:
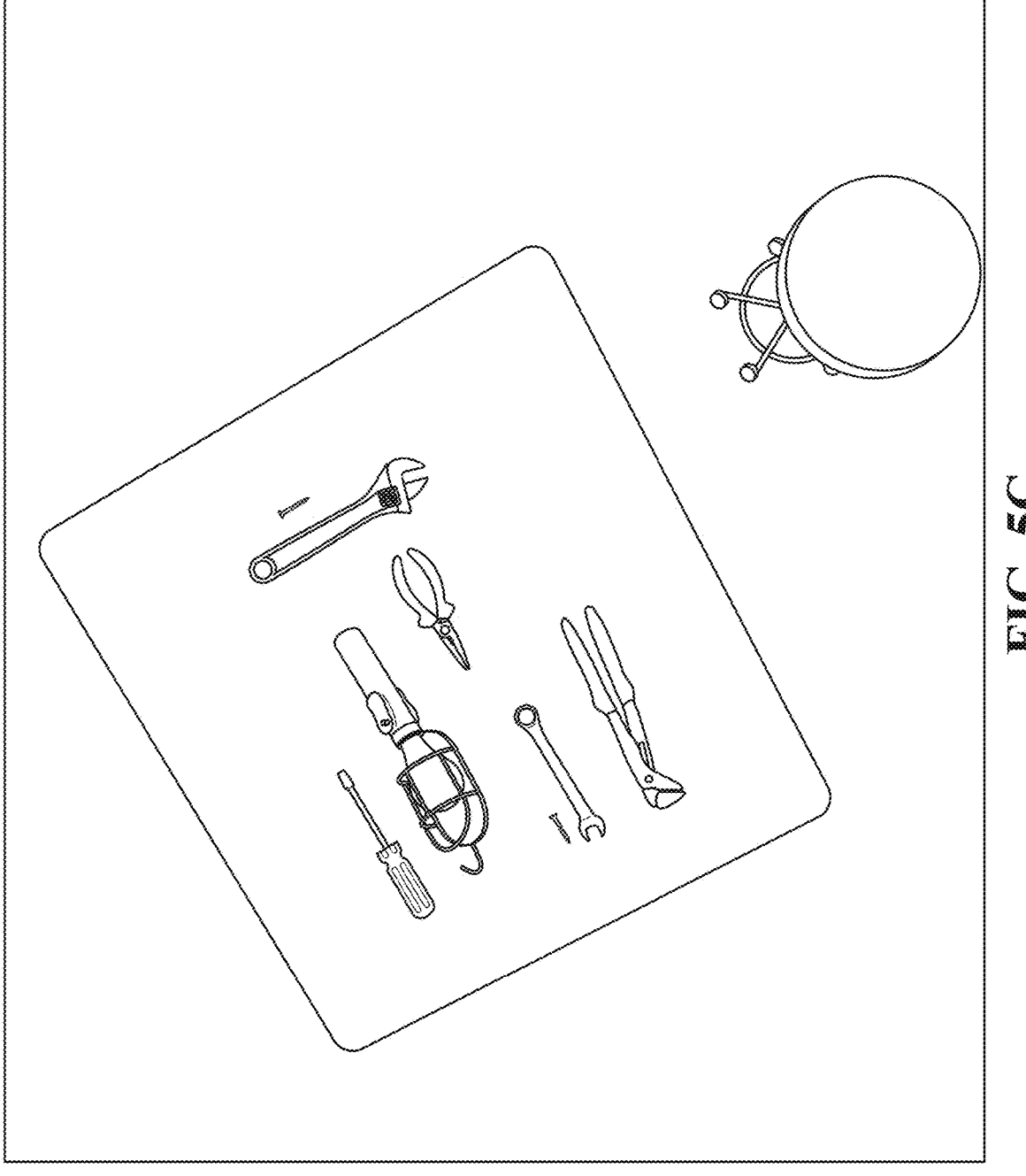
Figure 5D:
Figure 6:
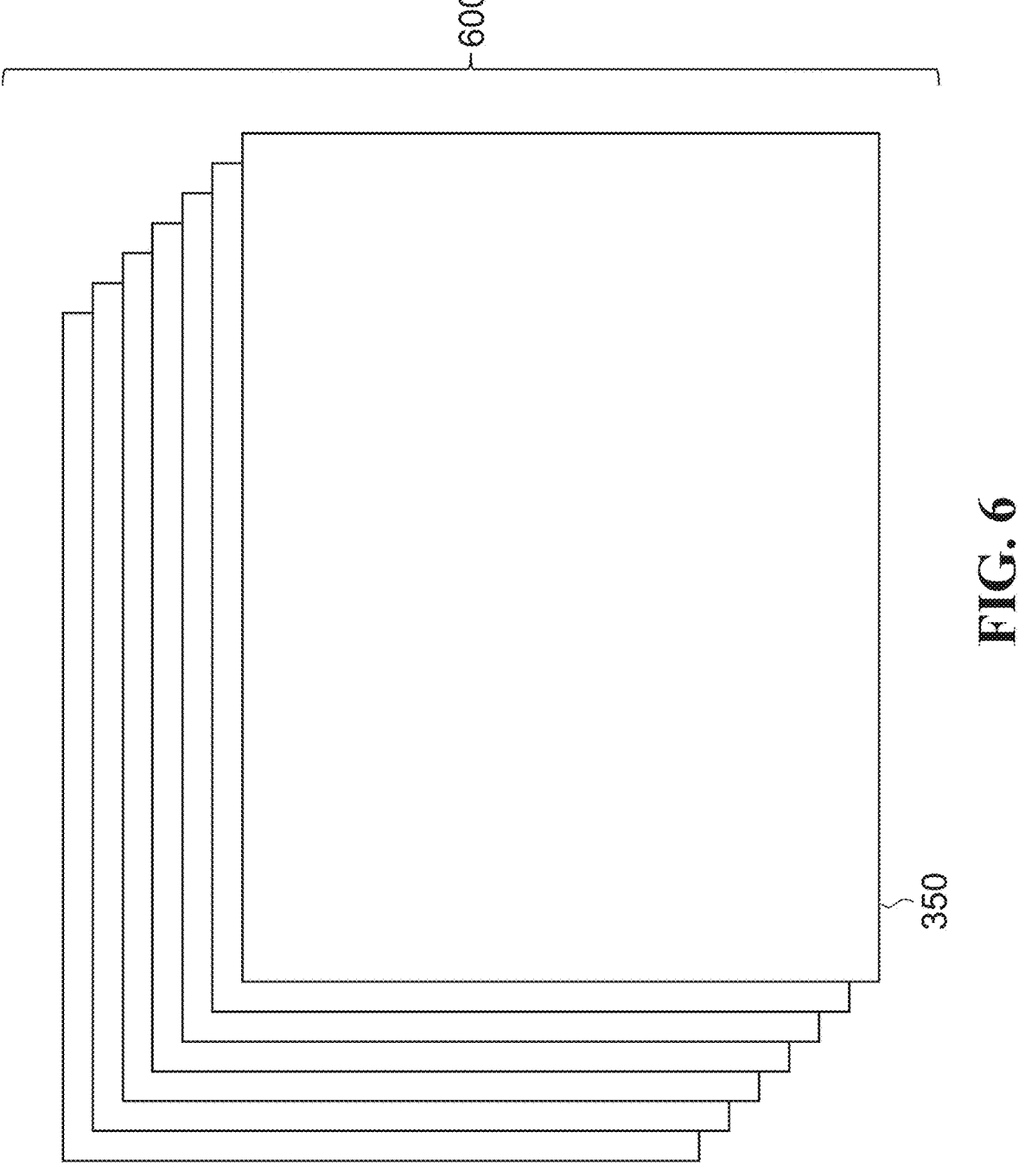
Figure 7:
Figure 7:
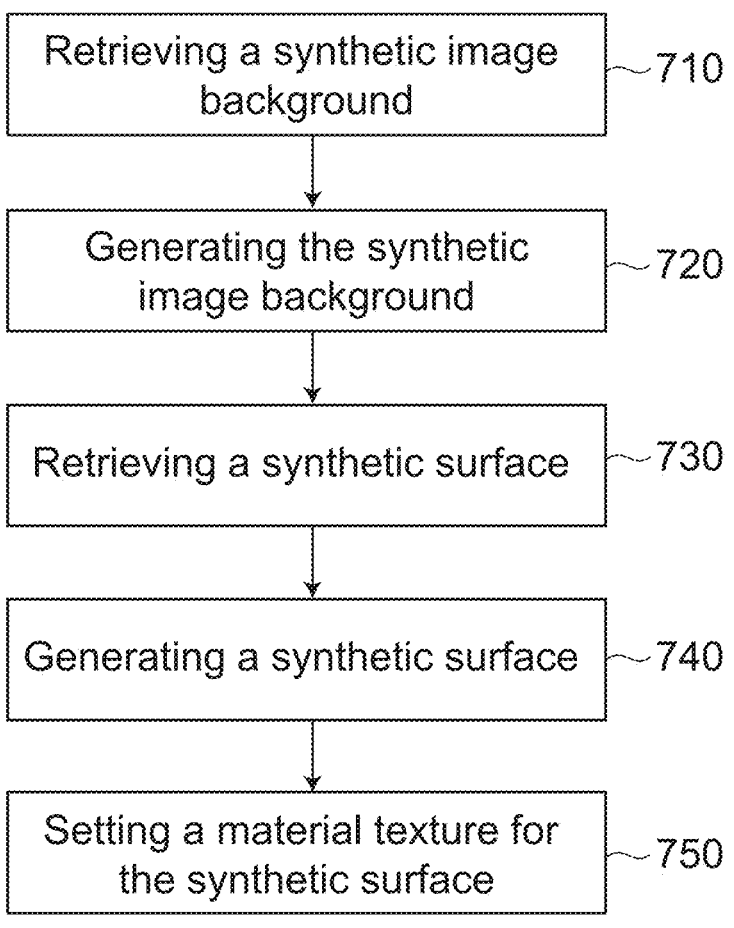
Figure 8:
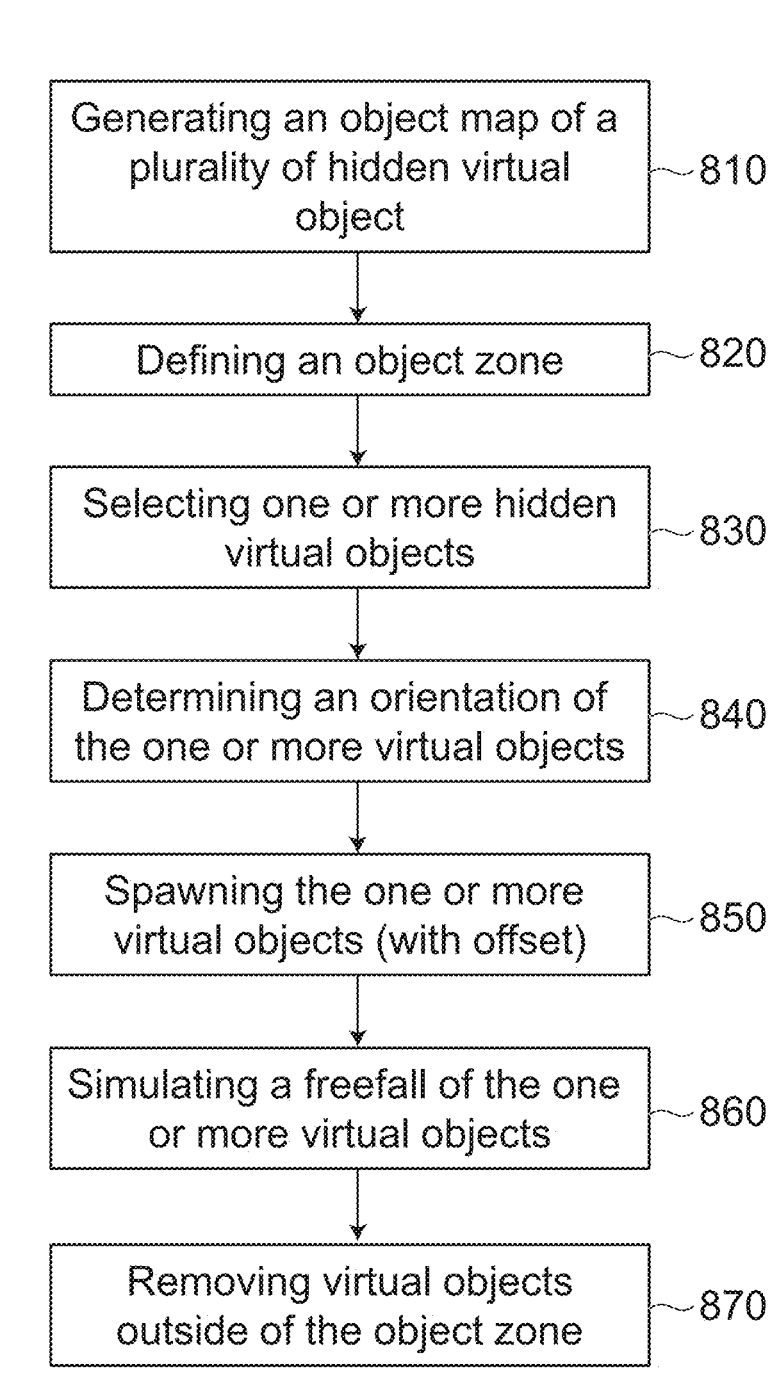
Figure 9:
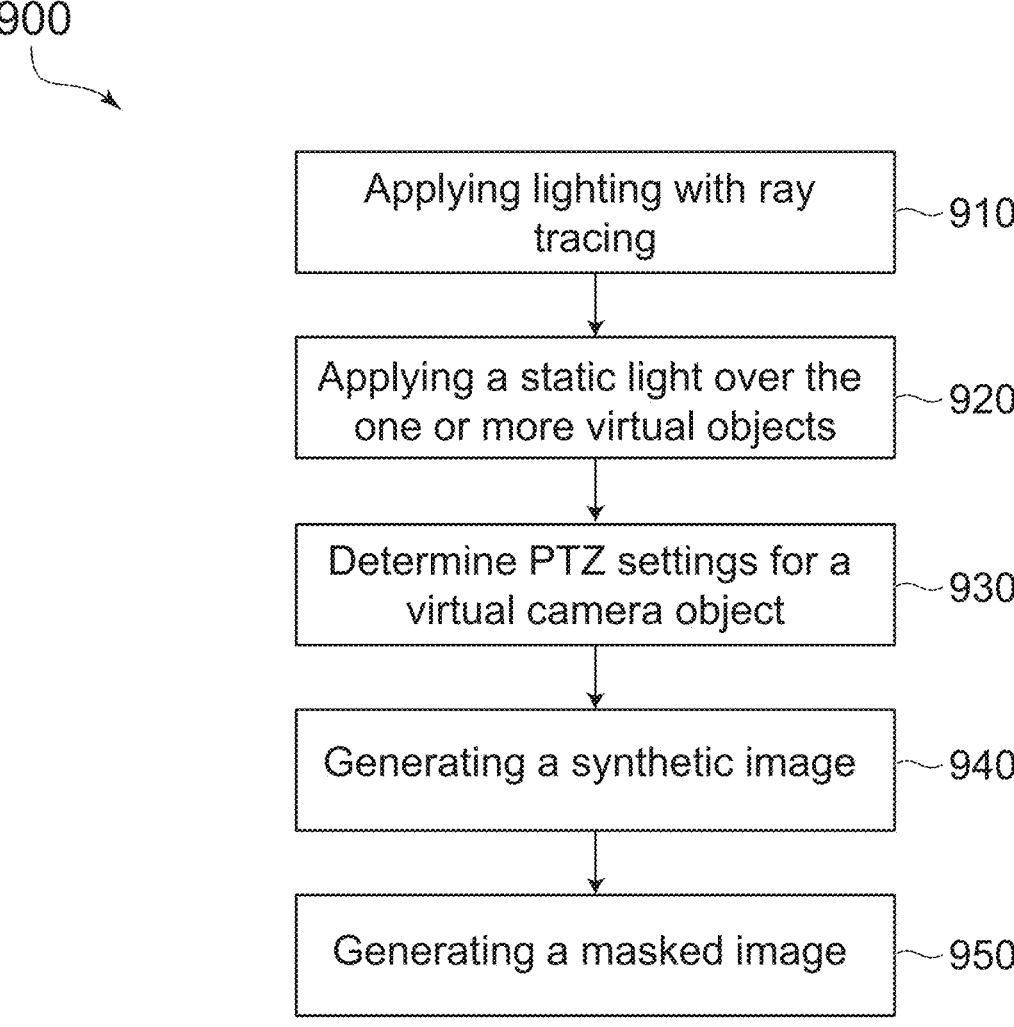
Figure 10B:
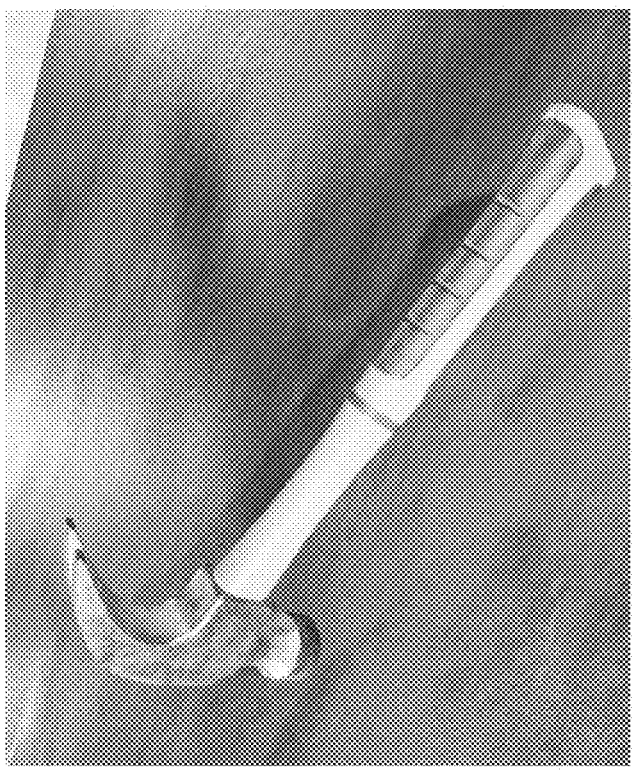
Figure 10B:
Figure 10A:
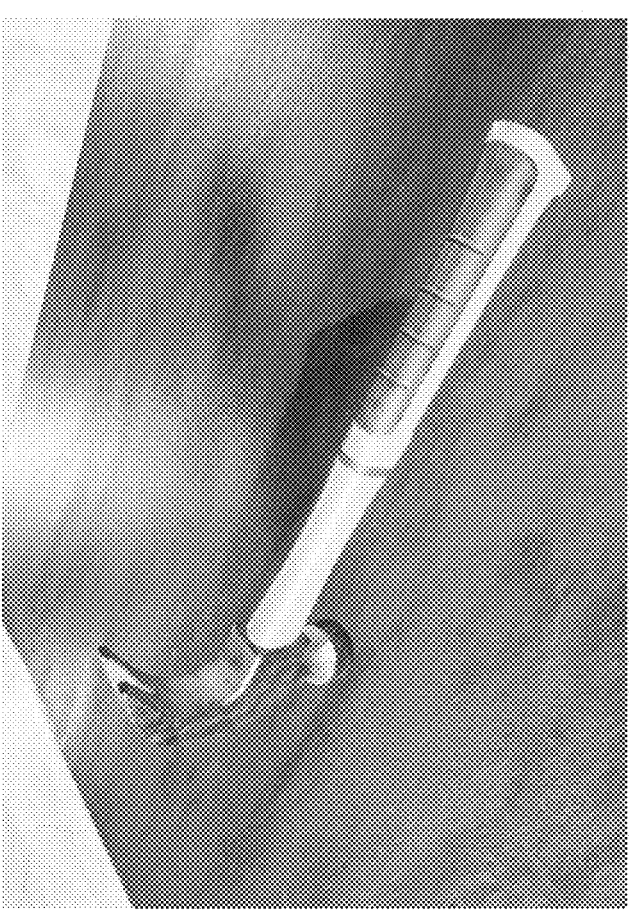
Figure 11B:
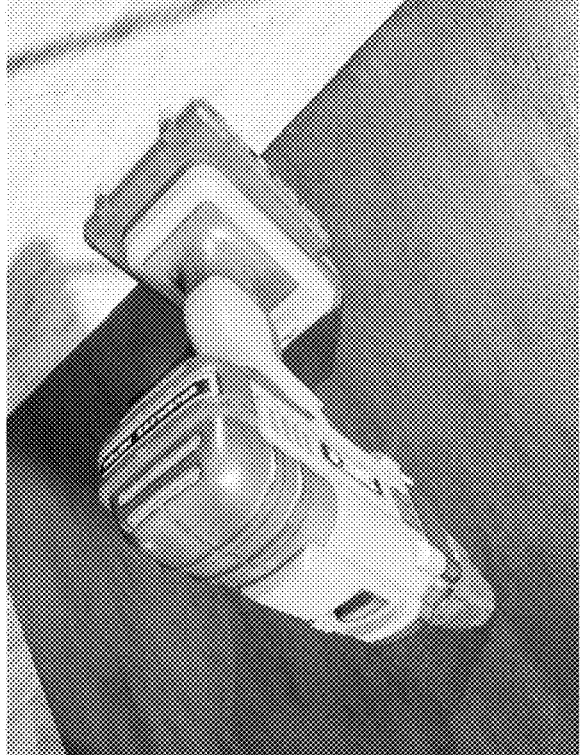
Figure 11A:
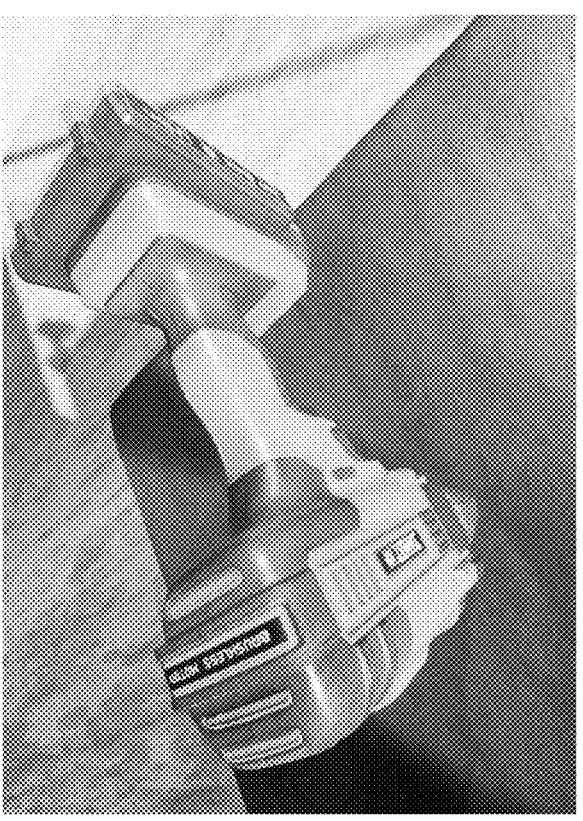

FIG. 3C is an image of the virtual objects of FIG. 3B showing a contour of the virtual objects once the synthetic image background has been removed;

FIG. 4A is an image of a first state of virtual objects in a virtual space positioned after a similar freefall, where one of the virtual objects is outside of the object zone;

FIG. 4B is an image of the virtual objects of FIG. 4A showing contours or masks of the virtual objects except for the virtual object that was outside of the object zone, where the virtual object outside of the object zone has been removed from the synthetic image;

FIG. 4C is an image of another exemplary simulated freefall of virtual objects in a virtual space;

FIG. 5A is an image of virtual objects positioned in a virtual space following a simulated freefall;

FIG. 5B is an image of the virtual objects of FIG. 5A showing contours or masks of the virtual objects once the virtual background has been removed;

FIG. 5C is an image of virtual objects positioned on a synthetic surface of a synthetic surface background;

FIG. 5D is an image of the virtual objects of FIG. 5A showing contours or masks of the virtual objects once the virtual background has been removed;

FIG. 6 is an image illustrating an exemplary simplified representation of a dataset of synthetic images;

FIG. 7 is a flowchart diagram of an exemplary method of generating an exemplary virtual space with an exemplary synthetic image background;

FIG. 8 is a flowchart diagram of an exemplary method of determining a position of one or more virtual objects following a simulated freefall with respect to the exemplary synthetic image background;

FIG. 9 is a flowchart diagram of an exemplary method of determining image settings for generating the synthetic image;

FIG. 10A is an example of a positioning of a virtual object on a synthetic image background while not taking into account the force of gravity or a center of mass of the virtual object, thereby resulting in a less realistic image;

FIG. 10B is an example of a positioning of the virtual object of FIG. 10A on the synthetic image background of FIG. 10A that takes into account the force of gravity and the center of mass of the virtual object, thereby resulting in a more realistic image than the image of FIG. 10A;

FIG. 11A is an example of a positioning of a virtual object on a synthetic image background while not taking into account the force of gravity or a center of mass of the virtual object, thereby resulting in a less realistic image; and FIG. 11B is an example of a positioning of the virtual object of FIG. 11A on the synthetic image background of FIG. 11A that takes into account the force of gravity and the center of mass of the virtual object, thereby resulting in a more realistic image than the image of FIG. 11A.

DETAILED DESCRIPTION

The present disclosure relates to systems and methods for generating a synthetic image, and a dataset of synthetic images, that imitates a real image by taking into account natural phenomena such as gravity and object properties (e.g. center of mass, weight of the object, material of the object, etc.) and/or with other environmental conditions (e.g. a trajectory of virtual objects or a position of the virtual objects may be affected by air movement or water movement, or virtual objects may deform and be elongated under different temperature or humidity conditions) when positioning the virtual object in a synthetic image background.

As a result of the synthetic image resembling a real image, less time is needed to train an artificial intelligence model using the dataset of synthetic images, as less correction is necessary when training the artificial intelligence model to compensate for the shortcomings of the synthetic images that fail to properly imitate or reproduce real images.

Therefore, the dataset of synthetic images may be used to train an artificial intelligence model that performs object recognition in an image (i.e. a real-world image captured by a camera; a virtual image; etc.) The object recognition may be performed in an image stream generated by a camera in close to real-time, from a playback of an image stream, etc. The trained artificial intelligence model may perform object recognition to identify parts in an assembly line during manufacturing using machines, for identifying and counting turtles in various environmental conditions, or identifying medical instruments in an operating room, or in other environments where objects need to be identified or tracked. It will be understood that other uses for a trained artificial intelligence model for performing object recognition may be contemplated without departing from the present teachings.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

From the foregoing it will be appreciated that, although specific embodiments have been described herein for purposes of illustration, various modifications may be made without deviating from the spirit and scope of the teachings. Accordingly, the claims are not limited by the disclosed embodiments.

Definitions

In the present application, by "object zone", it is meant an area in a three-dimensional space (e.g. typically a two-dimensional area in an image or a three-dimensional volume within the virtual space, defined by two or more points with x, y and z coordinates), defining boundaries in the virtual space for accepting or rejecting (removing or hiding) one or more virtual objects following the simulated freefall based on the position of each of the one or more virtual objects following the freefall. Virtual objects of the one or more virtual objects positioned within the object zone are kept visible in the visual space, thereby being visible in the corresponding synthetic image that is generated therefrom. Virtual objects of the one or more virtual objects positioned outside of the object zone are removed from or hidden in the virtual space, thereby not being visible in the corresponding synthetic image generated therefrom. Virtual objects of the one or more virtual objects that are partially located in the object zone may be removed from or hidden in the virtual space, or left visible in the virtual space, depending on the parameters that are set for generating the synthetic image.

In the present application, by "synthetic image", it is meant an image that is generated virtually, by computer, using computer graphics. In some examples, a synthetic image may include a skin or texture taken from a real-world image. In other examples, the synthetic image may be entirely generated by computer graphics.

In the present application, by "synthetic image background", it is meant the background of a synthetic image that is generated virtually, by computer, using computer graphics. In some examples, the synthetic image background may include a skin or texture taken from a real-world image. In other examples, the synthetic image background may be entirely generated by computer graphics. The synthetic image background may include one or more background virtual objects with respect to which one or more synthetic surfaces may be defined.

In the present disclosure, by "synthetic surface", it is meant a surface rendered as part of the synthetic background image, where properties are defined for the surface. Properties may include, but are not limited to, a texture, a colour, a softness or stiffness, a coefficient of friction, magnetic properties, etc. The synthetic surface, defined by its corresponding properties, may be accounted for when determining a position of a virtual object following a simulated freefall, resulting in a collision between the virtual object and the synthetic surface. The properties may also dictate other virtual object deformations following simulated environmental conditions.

In the present disclosure, by "virtual object", it is meant a computer-generated object. The virtual object may be defined as a 3D object corresponding to an object model of a real-world object, with or without a skin, with dimensions defined in the x, y and z axes. A virtual object may include metadata identifying a name or type of the real-world object corresponding to the virtual object, a mass value for the virtual object, a weight distribution for points of the virtual object, a center of mass defined as a point (x, y and z) of the virtual object, a material type defined by a string of characters, a density value, surface coefficient of friction, temperature and humidity-dependent material properties, etc.

In the present application, by "virtual space", it is meant the computer-generated three-dimensional (3D) space in which the synthetic image background will be rendered and the virtual objects will populate. The virtual space may be defined by a volume (e.g. a prism or cube) with a virtual width, height and depth.

Exemplary System for Generating a Dataset of Synthetic Images

Figure 1:
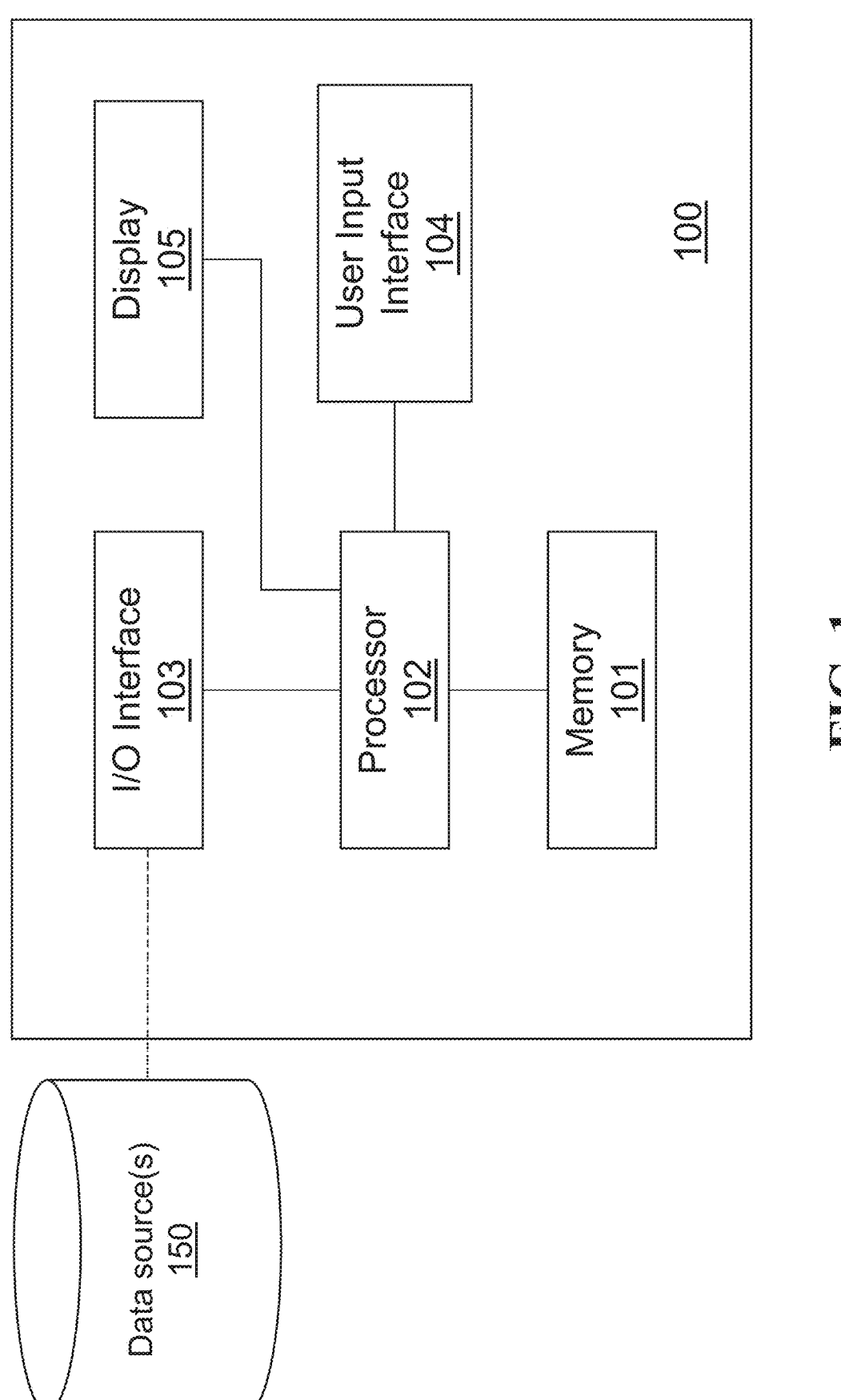
FIG. 1 is a block diagram of an exemplary system for generating a dataset of synthetic images interacting with one or more exemplary data sources.

Reference will now be made to FIG. 1, illustrating an exemplary environment of a system for generating a dataset of synthetic images 100. The system 100 is in communication, via a network (e.g. Internet, LAN network, etc.) with one or more data sources 150 (e.g. for storing datasets of synthetic images, virtual objects and metadata on the virtual objects, synthetic surface information, etc.) The system 100 may also be in communication with one or more remote computing devices (e.g. having stored thereon an artificial intelligence model that is trained or that is to be trained for object recognition using a dataset of synthetic images generated by the system 100).

The system 100 has at least one processor 102, memory 101 and at least one input/output interface 103 for communication with the one or more data sources 150 and/or the one or more remote computers.

The one or more data sources 150 may be one or more external database(s), one or more external systems, for example, having one or more databases, that are accessibly via Application Programming Interface (API) calls, and/or one or more local databases that are part of the system 100.

The system 100 may have an interface 103 for each of the data sources 150. A separate I/O interface 103 may also be provided in system 100 for communicating with the I/O interface 133 of the remote computer.

The processor 102 may be a general-purpose programmable processor. In this example, the processor 102 is shown as being unitary, but the processor 102 may also be multicore, or distributed (e.g. a multi-processor).

The computer readable memory 101 stores program instructions and data used by the processor 102. The computer readable memory 101 may also store synthetic images, virtual objects, metadata on the virtual objects, an object map, information on one or more synthetic surfaces, etc. The memory 101 may also store information regarding the data source(s) 150 that are accessible by the system 100, such as the identity of the data sources, a list of datasets of synthetic images, etc. The memory 101 may be non-transitory. The computer readable memory 101, though shown as unitary for simplicity in the present example, may comprise multiple memory modules and/or caching. In particular, it may comprise several layers of memory such as a hard drive, external drive (e.g. SD card storage) or the like and a faster and smaller RAM module. The RAM module may store data and/or program code currently being, recently being or soon to be processed by the processor 102 as well as cache data and/or program code from a hard drive. A hard drive may store program code and be accessed to retrieve such code for execution by the processor 102 and may be accessed by the processor 102 to store and access data. The memory 101 may have a recycling architecture for storing, for instance, retrieved data for setting up the virtual space and the one or more virtual objects with respect to the virtual space, where older data files are deleted when the memory 101 is full or near being full, or after the older data files have been stored in memory 101 for a certain time.

The I/O interface 103 is in communication with the processor 102. The I/O interface 103 may include a network interface and may be a wired or wireless interface for establishing a remote connection with, for example, a remote server, an external data source 150, a remote computer, etc. For instance, the I/O interface 103 may be an Ethernet port, a WAN port, a TCP port, etc.

The processor 102, the memory 101 and the I/O interfaces 103 may be linked via bus connections.

The data source(s) 150 may be one or more remote server(s) including one or more databases. A data source 150, and in particular a database, may contain one or more datasets of synthetic images, information for generating virtual objects, information for generating a synthetic image background with one or more synthetic surfaces, one or more IP addresses of respectively one or more remote computers adapted to receive a dataset of synthetic images generated by the system, etc.

In some examples, the system 100 may have a local database stored, e.g., in memory 101, that contains a list of navigation controls, etc.

The remote computer may be in communication with the I/O interface 103 of the system 100. The remote computer has a processor, a memory, an I/O interface that may be linked via bus connections. The remote computer may have (or be connect to) any suitable I/O device(s), for example, such as a keyboard, a mouse, a touchscreen etc. The remote computer may be a desktop computer, a laptop, a smartphone, a tablet, etc. There may be more than one remote computer in communication with the system 100.

In some instances, the remote computer may have stored in its memory an artificial intelligence model that is trained or to be trained using one or more datasets of synthetic images for performing object recognition. The remote computer may receive the dataset of synthetic images and introduce the dataset of synthetic images to the artificial intelligence model. The artificial intelligence model may process the synthetic images to identify the one or more virtual objects appearing in each of the synthetic images of the dataset. User feedback may be provided to the artificial intelligence model to correct or guide the artificial intelligence model in recognizing the virtual objects in the synthetic images. The artificial intelligence model may be sufficiently trained when the artificial intelligence model reaches a sufficient level of confidence in recognizing the virtual objects in the synthetic images. When the artificial intelligence model is believed to be sufficiently trained, the artificial intelligence model may be presented with one or more real images (or an image stream) captured by a camera, and the artificial intelligence model is caused to recognize the objects in the real image.

In some embodiments, the system 100 may include at least one remote computer, where, for instance, the connection between the system 100 and the remote computer may be a wired connection or a wireless connection. In some embodiments, the functionality of the system 100 and the remote computer may be implemented on a single computing device.

Exemplary Software Architecture for Generating a
Dataset of Synthetic Images

Figure 2:
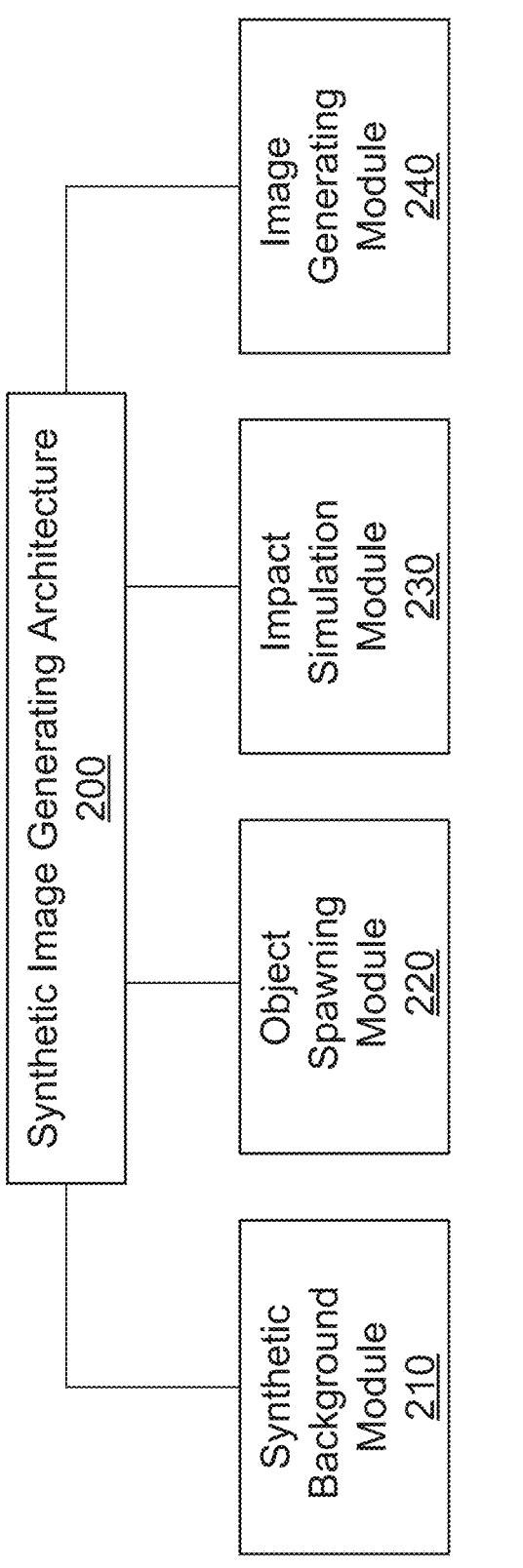
FIG. 2 is a block diagram of an exemplary software architecture for generating a dataset of synthetic images.

Reference is now made to FIG. 2, illustrating an exemplary software architecture 200 of the system 100 for generating a dataset of synthetic images.

The system 100 has program code, stored in memory 101, that includes a synthetic background module 210. The system 100 has program code, stored in memory 101, that includes an object spawning module 220. The system 100 has program code, stored in memory 101, that includes an impact simulation module and/or environmental simulation module 230. The system 100 has program code, stored in memory 101, that includes an image generating module 240. Each of the synthetic background module 210, the object spawning module 220, impact simulation module and/or environmental simulation module 230 and the image generating module 240 includes program code configured to implement the functionality of the modules as is described herein.

The synthetic background module 210 includes program code stored in memory 101 that, when executed by the processor 102, causes the processor 102 to generate a synthetic image background in a virtual space, the synthetic image background appearing in the later-generated synthetic image. The synthetic image background includes one or more synthetic surfaces. A synthetic surface may include one or more properties such as a friction coefficient, a hardness or softness coefficient. The synthetic surface may appear as having a texture or colour. The synthetic surface may be associated with a real-world material type. A synthetic image background may include a plurality of synthetic surfaces. A synthetic surface may be associated with a background virtual object (such as a tray, a table, a countertop) on which the one or more virtual objects are to be positioned. The synthetic image background is included as the background of the synthetic image on which the one or more virtual objects will be generated. The synthetic background module 210 may include program code for causing the processor to vary the synthetic surface positions, the number of synthetic surfaces, the properties of the synthetic surfaces, yielding a different synthetic image background for different synthetic images forming a dataset of synthetic images.

The object spawning module 220 includes program code stored in memory 101 that, when executed by the processor 102, causes the processor 102 to spawn one or more virtual objects in the virtual space over the synthetic image background. The spawning of the one or more virtual objects may be performed by generating an object map of a plurality of virtual objects presented in a hidden mode, where a selected one or more virtual objects of the object map are selected and revealed, resulting in the spawning of the one or more virtual objects. The object spawning module 220 may include program code for causing the processor 102 to populate the object map with virtual objects of a certain type (e.g. surgical items; classroom items; manufacturing items; etc.) The object spawning module 220 may cause a selection of one or more virtual objects from the object map randomly, or based on a predefined condition (e.g. proximity to an object zone as explained herein). The object spawning module 220 may include program code for causing the processor to vary the spawned one or more virtual objects for different synthetic images of a dataset of synthetic images. The object spawning module 220 may also cause the processor to select one or more virtual objects to spawn based on a location of the one or more virtual objects with respect to a location of one or more synthetic surfaces of the synthetic image background.

The impact simulation module and/or environmental simulation module 230 includes program code stored in memory 101 for, when executed by the processor 102, causing the processor 102 to determine a position of the one or more virtual objects on the synthetic image background spawned by the object spawning module 220. The impact simulation module and/or environmental simulation module 230 causes the processor 102 to determine the position of the spawned one or more virtual objects by simulating a freefall of the spawned one or more virtual objects, spawned by the object spawning module 220 at an arbitrary virtual height above one or more synthetic surfaces of the one or more synthetic image background. The simulated freefall is performed by the impact simulation module and/or environmental simulation module 230 by applying a gravity simulation, causing the spawned one or more virtual objects falling from the arbitrary virtual height to the one or more synthetic surfaces. The properties of the one or more virtual objects and of the one or more virtual objects, following a collision, determine a position of the one or more virtual objects following the simulated freefall. In some instances, the impact simulation module and/or environmental simulation module 230 hides or removes virtual objects of the one or more virtual objects that are positioned outside of an object zone following the simulated freefall. The impact simulation module and/or environmental simulation module 230 may further determine an orientation and tilt of an object following the simulated freefall (e.g. determined from a center of mass and/or weight distribution of the virtual object).

In some examples, the impact simulation module and/or environmental simulation module 230 may further include program code stored in memory 101 for applying a simulation of one or more environmental conditions that may impact the properties of the one or more virtual objects and/or one or more of the synthetic surfaces. Exemplary environmental conditions may include a temperature, a humidity level, air flow, water flow, fluid flow, pressure, turbulence, etc.

The image generating module 240 includes program code stored in memory 101 that, when executed by the processor 102, causes the processor 102 to generate the synthetic image from the virtual space including the synthetic image background with the one or more virtual objects positioned after the simulated freefall. The image generating module 240 may cause the processor 102 to adjust parameters for generating the synthetic image, such as the viewing angle (the pan, tilt and/or zoom) of the virtual camera object defined for capturing the synthetic image, the lighting of the one or more virtual objects, the one or more synthetic surfaces, etc.

Each of the synthetic background module 210, the object spawning module 220, the impact simulation module and/or environmental simulation module 230 and the image generating module 240 may function in sequence for generating the synthetic images of the dataset of synthetic images. In some examples, where the synthetic image background remains the same between synthetic images, the object spawning module 220, the impact simulation module and/or environmental simulation module 230 and the image generating module 240 may instead run in sequence for the same synthetic image background. Similarly, in examples where the spawned virtual objects are the same between synthetic images, the synthetic background module 210, the impact simulation module and/or environmental simulation module 230 and the image generating module 240 may run in sequence for generating the synthetic images, where the object spawning module 220 spawns the same one or more virtual objects for the sequence of synthetic images.

In some instances, the generating of the synthetic image background and the virtual objects, with the lighting properties, object properties, surface properties, as defined herein, may be performed by using, or supplemented with, graphical rendition software developed for videogames. However, it will be understood that other software application programs may be used for generating the synthetic images described herein (such as urban planning software application programs).

Exemplary Method of Generating a Synthetic Image Background

Reference will now be made to FIG. 7, illustrating an exemplary method 700 of generating a synthetic image background. The method 700 may be performed by system 100, or any other system in accordance with the present teachings.

A virtual space is provided, the virtual space representing a computer-generated space for populating by a synthetic image background and the one or more virtual objects. The virtual space defines the boundaries of a volume in a computer-generated environment that receives and contains the synthetic image background and the one or more virtual objects.

Information for generating a synthetic image background is retrieved from memory (e.g. local memory, an external data source) at step 710. The information for generating a synthetic image background includes sufficient information for generating the synthetic image background such as colours, dimensions, textures, to graphically represent the background of the synthetic image. For instance, for a synthetic image in a manufacturing setting, the data for generating a synthetic image background may also include data for populating the virtual space with a concrete floor, and background virtual objects such as a large diffuse lamp suspended fairly high, a manufacturing assembly tool, etc., objects that are traditionally found in a manufacturing shop floor. The data for generating the synthetic image background may also include information for positioning the one or more background objects in the virtual space. In some embodiments, the data for generating the synthetic image background may be a virtually generated image that serves as a backdrop for receiving the synthetic surface information and the one or more virtual objects as described herein. In some examples, the data for generating a synthetic image background may be a background image selected from a plurality of available background images (e.g. different top-down images of interior manufacturing spaces, of an outdoors scene, etc.), where a selection of one of the available background images is made to generate the synthetic image background. Data to overlay additional virtual background objects may be provided as part of the data to generate the synthetic image background, where in these examples, the data may include position information for the additional virtual background objects.

The synthetic image background is generated in the virtual space at step 720, in accordance with the retrieved data for generating the synthetic image background. For instance, when the data for generating the synthetic image background is a selection of one synthetic image background amongst a plurality of available synthetic image backgrounds, the synthetic image background is generated in accordance with the selected synthetic image background. In one example, when the data for generating a synthetic image background includes instructions for populating the virtual space to generate the synthetic image background (e.g. colour, textures, patterns, dimensions and positions of the different parts yielding the synthetic image background), the instructions to generate the synthetic image background are carried out to result in the synthetic image background.

Data to generate or define the synthetic surfaces in the synthetic image background is retrieved at step 730. Data related to the synthetic surfaces may include, but is not limited to the dimensions, positions and properties (e.g. colour, texture, etc.) of one or more synthetic surfaces. The synthetic surfaces may define surfaces of background virtual objects, such as counters, tables, mats or other surfaces on which the one or more virtual objects may be positioned following the simulated freefall and/or simulated environmental conditions. As such, the data to generate the synthetic surfaces include instructions to position the synthetic surfaces with respect to the generated synthetic image background. Information for generating a synthetic surface may include other properties (e.g. stored in metadata associated with the synthetic surface object) for defining an interaction with the synthetic surface, such as a represented material of the synthetic surface, its softness, a friction coefficient, a slope or angle of the synthetic surface, etc. Other environment background virtual objects may be provided to populate the synthetic image background with additional context or clutter (such as images and/or virtual objects representing of a lamp, a plant, tree, a person, etc.).

The data for generating the synthetic surfaces may be determined through a random selection of certain of the properties of the synthetic surfaces (e.g. position and dimensions of the synthetic surface, material of the surface), where values for these different properties may be selected randomly amongst a predefined range of values or properties (e.g. three possible surface materials to select from, positions within the virtual space where the virtual surface is to be generated.) In some embodiments, data for generating the synthetic surfaces may include data for establishing difference in height in the virtual space between synthetic surfaces (e.g. where a synthetic surface for a table is defined as being higher than a synthetic surface for a floor).

The one or more synthetic surfaces are then generated in the synthetic image background, defined in the virtual space as a function of the retrieved synthetic surface data at step 740. The synthetic image background is populated by the synthetic surfaces which are characterized, dimensioned and positioned (e.g. through use of coordinate system) as a function of the retrieved data for generating the synthetic surfaces. For instance, the synthetic surface for a table may be positioned at a bottom right corner of the synthetic image background, for a steel surface covered with a paper pad. Relative differences in height may also be accounted for and defined in the synthetic image background in accordance with the data for generating the synthetic surfaces. For instance, a table may be defined as being at a height of one meter from the synthetic surface of the floor, defined in the virtual space. The synthetic image background may include metadata defining the properties of the different synthetic surfaces in the virtual space, such as the boundaries of the synthetic surface, the imitated real-life material of the synthetic surface, the roughness or friction coefficient of the synthetic surface, the angle or slope of the synthetic surface, etc. This metadata is accounted for when calculating a position of a virtual object following an interaction or collision between the synthetic surface and the virtual object, as part of the trajectory of the virtual object following the simulated freefall and/or simulated environmental conditions. In some examples, each surface displayed in the synthetic image background is defined as a synthetic surface with metadata defining the properties of the synthetic surface. In some examples, only certain surfaces displayed in the synthetic image background is defined as a synthetic surface with metadata defining the properties of the synthetic surface.

It will be understood that in some examples, steps 710 and 730 may be performed concurrently, as well as steps 720 and 740, where the retrieved data for generating the synthetic image background includes the data for generating the one or more synthetic surfaces associated with the retrieved data for generating the synthetic image background. In these examples, the one or more synthetic surfaces are defined upon the generating of the synthetic image background, the data on the synthetic surfaces stored as metadata qualifying different portions of the synthetic image background associated with the synthetic surfaces.

In some instances, material properties, such as texture, of the one or more synthetic surfaces, is set at step 750 (e.g. stored as metadata associated with the synthetic image and of the synthetic image background). For instance, when the selected material for a synthetic surface is steel, the material texture may be defined as smooth, with a low coefficient of friction. When the selected material for a synthetic surface is a quilted pad, the material may be set as soft yet with a higher coefficient of friction. It will be understood that step 750 may be performed concurrently with step 750, as part of generating or defining the one or more synthetic surfaces in the synthetic image background.

The synthetic image background is now generated, imitating or replicating a real-time background setting, including one or more defined synthetic surfaces with set properties for influencing a simulated interaction between the synthetic surface and the virtual object.

Exemplary Method for Positioning One or More Virtual Objects with Respect to the Synthetic Image Background Reference is now made to FIG. 8, illustrating an exemplary method 800 for positioning one or more virtual objects with respect to the generated synthetic image background. The method 800 may be performed by system 100, or any other system in accordance with the present teachings.

In some embodiments, an object map of hidden virtual objects may be generated, the object map occupying a part of the virtual space or an entire plane of the virtual space at step 810. The virtual objects of the object map are added in a hidden mode, where they are not visible in the virtual space when hidden. Once selected, selected virtual object(s) of the object map are revealed in the virtual space. Different object maps may exist for different types of virtual objects (e.g. manufacturing tools; surgical tools; animals in their natural habitat; etc.), where a selection of a type of object map, with virtual objects of a particular type, may first be performed by, e.g., the user through the receipt of user input.

The object map may be a constellation or network of virtual objects, where each virtual object of the object map occupies a position in the virtual space defined in the x, y and z axes. Virtual objects occupy an initial position at a height (z) above the one or more synthetic surfaces or synthetic image background.

In some embodiments, an object zone is defined in the virtual space (e.g. synthetic image background) at step 820. The object zone defines a space (a 3D space in the virtual space or a region corresponding to, 2D zone within the resulting synthetic image) that sets the boundaries for acceptable virtual object positions following the simulated freefall and/or simulated environmental conditions. Virtual objects positioned outside of the object zone following the simulated freefall and/or environmental conditions may be discarded (removed or hidden) such that they are not part of the resulting synthetic image. The object zone may be predetermined by encompassing an area occupied by a synthetic surface or a background virtual object of interest with a synthetic surface (such as the flat surface of a table) of the synthetic image background, or may be defined by a user providing user input defining an area (e.g. a parallelogram) in the virtual space. An object zone 310 is defined in the example of FIG. 3A.

In the example where an object map is provided defining a plurality of hidden virtual objects, a selection of one or more of the hidden virtual objects is performed at step 830. The selection may be performed randomly, where each of the objects of the object map is assigned an integer, where virtual objects having an integer corresponding to an integer generated following a random number generation, are revealed. The selection may also be performed through a selection of one or more object properties, such as shape, weight, material, function, etc., using a query defining the one or more properties as criteria of the query, where the virtual objects matching the one or more criteria of the query are revealed.

In some embodiments, a selection of the one or more virtual objects of the object map may be performed based on the location of the object zone, where virtual objects that are proximate to the object zone are revealed.

In some instances, an orientation of the one or more selected virtual objects is determined prior to spawning the one or more virtual objects at step 840. An orientation may be determined in each of the three planes xy, xz, and yz, where a number from 0° to 360° is selected in each plane. The selection of the orientation may be performed randomly, or may account for certain factors such as the location of the object zone, the location, orientation and/or size of proximate virtual objects that are selected to be revealed, or typical patterns of the real objects due to human interventions in the real environment, etc.

It will be understood that in some examples, virtual objects may be spawned or revealed in the virtual space without first generating an object map. In one example, one or more virtual objects may be selected from a library of virtual object models (with, in some cases, different skins). The selection may be performed randomly, or based from a set of properties, the library of virtual objects queried with the sought properties. Data for generating the one or more virtual objects is retrieved from the library, and the one or more virtual objects are spawned into the virtual space based on the retrieved data for generating the one or more virtual objects. An orientation of each of the virtual objects may be determined randomly in each of the three planes, or determined based on a set of criteria or conditions. A position of each of the virtual objects may be determined randomly, or determined based on a set of conditions (e.g. a distance range from the object zone, a distance range from other virtual objects, etc.).

Each of the virtual object models (e.g. of the object zone) may include metadata with a tag or label defining the identity or properties of the virtual object (e.g. name; weight; weight distribution; center of mass; etc.).

In some instances, a number of virtual objects to spawn may depend on the dimensions of the object zone, where a larger object zone results in the spawning of a greater number of virtual objects.

In some embodiments, each of the one or more virtual objects may be spawned at a position such that there is an offset or space between each of the spawned one or more virtual objects, such that the virtual objects of the one or more virtual objects are not touching when spawned. The one or more virtual objects may be spawned in proximity to the object zone in instances where an object zone has been defined. The spawned one or more virtual objects may be directly spawned over the object zone or within a predefined range of possible distances from the object zone (along the x and/or y axis).

In some embodiments, different virtual objects may be spawned at different heights (at different values in the z axis), where some virtual objects of the one or more virtual objects may be spawned with a higher value in the z-axis than some of the other virtual objects of the one or more virtual objects.

The virtual objects are spawned in the virtual space at step 850. The spawning of virtual objects selected from an object map of hidden virtual objects may include the revealing of the selected virtual objects. When no object map is present, the spawning may include the generating or manifesting of the virtual objects by generating an object model of the virtual object (e.g. with a skin) at a position in the virtual space. The virtual objects may be spawned with an offset from the object zone or from the one or more synthetic surfaces of the synthetic image background. The offset is a virtual representation of the virtual objects being at an arbitrary height (z) above a value in the z-axis corresponding to the plane defining the synthetic surface or part of the synthetic image background, for simulating a freefall from that height (z) above the synthetic surface or part of the synthetic image background toward the synthetic surface or part of the synthetic image background.

In some embodiments, a mask may be generated for each of the virtual objects (hidden virtual objects of the object map or spawned). The mask is a shape that contains the virtual object, related to the dimensions of the virtual object. For instance, the mask may be a parallelogram defined as two points in space (with x, y and z coordinates), the mask defined as the smallest parallelogram possible that contains the virtual object.

A freefall is then simulated of the one or more spawned virtual objects at step 860. The simulated freefall imitates the trajectory of a real object falling from a height when subject to the force of gravity. A force of gravity may be simulated by attributing each of the virtual objects with a mass and applying known laws of gravity (i.e. an acceleration of 9.81 m/s$^2$ towards the ground). The simulation of the freefall may be performed as soon as the one or more virtual objects are spawned, or after a period of time following the spawning of the one or more virtual objects (e.g. the freefall may be simulated following receipt of corresponding user input triggering the freefall simulation).

The simulated freefall results in a collision between the one or more virtual objects with the synthetic image background (or in some embodiments, when defined, the synthetic surface). In some instances, there may also be a collision between spawned virtual objects of the one or more virtual objects depending on the trajectory of the one or more virtual objects during the simulated freefall.

A determination of the outcome of the collision between the virtual object and the synthetic image background may depend upon the attributes or properties assigned to each of the virtual objects (such as the mass value of the object, size of the object, weight distribution assigned to the object, abrasiveness value of the object, the shape of the object, etc.) and/or the properties of the surface (e.g. synthetic surface) of the synthetic image background with which the virtual object collides (e.g. angle of the surface, a coefficient of friction value of the surface, the stiffness value of the surface, etc.).

The simulated freefall and/or simulated environmental conditions leading to the simulated collision between the virtual object and the surface of the synthetic image background results in a determination of the position of the virtual object in the virtual space. The position of the virtual object in the virtual space is established when the virtual object is at rest or is immobile in the virtual space.

In some instances, the position of the virtual object in the virtual space may include an orientation of the object or tilt of the object determined, e.g., from the weight distribution of the virtual object, per the object model of the virtual object, the center of mass of the virtual object, etc.) The behaviour of the virtual object subject to the simulated force of gravity may de refined through the use of the center of mass and weight distribution of the virtual object to closely imitate the movement of an equivalent real object when subject to the force of gravity. The inclusion of these additional properties of the virtual object when determining the position of the virtual object following the freefall and environmental conditions simulation results in still synthetic image that closely imitates the layout of equivalent real objects in real space, improving the quality of the resulting synthetic image for purposes of training an artificial intelligence model for object recognition within an image or a stream of images (in a video stream).

In some embodiments, when an object zone has been defined, virtual objects that are positioned outside of the object zone following the simulated freefall and/or simulated environment conditions are removed or hidden at step 870. As a result, these virtual objects that are positioned outside of the object zone will not be visible in the resulting synthetic image. In some instances, a rule may be set that establishes that a virtual object that is at least in part outside of the object zone is to be removed or hidden. In other instances, a rule may be set that establishes that only virtual objects that are entirely outside of the object zone are to be removed or hidden.

The simulated freefall and/or simulated environment conditions of the one or more virtual objects, following the spawning of the one or more virtual objects, results in a positioning of the one or more virtual objects (excluding those, in some instances, that are outside of the object zone) that imitates a similar positioning of equivalent one or more real objects if subject to the freefall in a real environment. The result is a setup of the one or more virtual objects in the virtual space that closely imitates an image in real space of equivalent real objects, without having to manually take each of the photographs of real objects, thereby saving time in generating the setup of the real objects that will be the subjects of the virtual objects.

An example of a hammer virtual object is provided at FIGS. 10A and 10B. FIG. 10A shows a hammer virtual object positioned on a synthetic surface (imitating a steel surface). The positioning of the hammer virtual object does not take into account the weight distribution or the center of mass of an actual hammer, so the hammer virtual object is resting on the head of the hammer virtual object. This is inconsistent with the behaviour of a real-world hammer when subject to gravity, as significant weight rests in the handle of the hammer. In contrast, FIG. 10B illustrates the positioning of a hammer virtual object that includes data on a weight distribution and/or center of mass of an actual hammer, influencing the positioning of the hammer virtual object on the synthetic surface. The hammer virtual object is defined as having additional weight in the handle portion of the hammer virtual object, causing the positioning of the hammer virtual object to rest at an angle both on the head of the hammer virtual object and on the tip of the handle of the hammer virtual object.

A further example is provided in FIGS. 11A and 11B, illustrating a drill virtual object. FIG. 11A shows the drill virtual object resting on the tip of the drill virtual object. The positioning of the drill virtual object does not take into account the weight distribution and/or center of mass of a real drill. In contrast, FIG. 11B illustrates the drill virtual object positioned as resting on both the drill tip the drill base, corresponding to the positioning of a real drill when subject to the force of gravity, based on the weight distribution and center of mass of a real drill.

In some instances, the simulated freefall and collision between the virtual objects and the synthetic image background (e.g. synthetic surfaces) may be further determined by setting one or more environmental conditions that influence a behavior or property of the virtual object or the synthetic image background.

For instance, the environmental condition may be a humidity index or temperature. An increased temperature may cause a virtual object with a set material to expand or contract, depending on the nature of the set material. A coefficient of friction for the air may also be set, where a denser object may fall faster than a less dense object (such as paper when compared to a hammer), as the trajectory of the less dense object is influenced by the air resistance in this example.

A first example is illustrated at FIG. 3A for generating a synthetic image. The synthetic image background is that of a top-down view of a mechanics room. An object zone 310 is defined as including a synthetic surface 311 representing a steel tabletop, where a hardness, friction and texture of the synthetic surface may be included in metadata of the synthetic image background.

Virtual objects 315A are shown to spawn with a height variable (z) over the object zone 310 and synthetic surface 311 in FIG. 3A, where FIG. 3A illustrates the virtual objects a simulated freefall. Another example of a simulated freefall is shown at FIG. 4C.

FIG. 3B illustrates the positioning of virtual objects 315A on the synthetic surface 311, following a simulated freefall of the virtual objects 315A onto the synthetic surface, the freefall calculated from the defined height variable (z).

A synthetic image is generated from the virtual space shown in FIG. 3B, including the synthetic image background and the three virtual objects 315A. A corresponding masked image of the synthetic image, where only contours 315C of the visible one or more virtual objects 315A are shown, and the synthetic image background is obscured, is shown in FIG. 3C.

A second example is illustrated in FIGS. 4A to 4B. Positions of virtual objects 315A.1 and 315A.2 are illustrated at FIG. 4B, as determined following the simulated freefall. The virtual object 315A.2 is positioned outside of the object zone 310. As a result, the virtual object 315A.2 is removed or hidden. The resulting synthetic image does not include virtual object 315A.2, as further illustrated by the corresponding masked image of the synthetic image shown at FIG. 4B. Virtual objects 315A.1 are shown in the synthetic image, contained within the object zone 310.

A third example is illustrated in FIGS. 5A and 5B.

FIG. 5A shows virtual objects 315A.1 and 315A.2 after having been spawned over an object zone 310 defining a synthetic surface reproducing a tabletop of a table.

Following the simulated freefall, FIG. 5A illustrates the virtual objects 315A.1 and 315A.2 positioned following the freefall simulation. Virtual objects 315A.1 are positioned within the object zone 310, where virtual object 315A.2 is positioned at an edge of the object zone 310, the simulated freefall calculating that virtual object 315A.2 is positioned to rest on an edge of the background virtual object of the table.

As parameters for the generating of the synthetic image in the examples illustrated at FIGS. 5A-5B are set to include virtual objects positioned at least in part within the boundaries of the object zone 310, virtual object 315A.2 is not hidden or removed.

The resulting synthetic image includes virtual objects 315A.1 and 315A.2 as further illustrated by the corresponding masked image of the synthetic image shown at FIG. 4A.

A further example of virtual objects positioned on a synthetic surface is shown at FIG. 5C. In FIG. 5C, the virtual objects are positioned on the synthetic surface without a simulated freefall. In this example, one or more environmental conditions are simulated to influence properties (e.g.

dimensions) of the virtual objects based on the material information stored in the metadata for each of the virtual objects. A function may be performed to cause an expansion or contraction of the dimensions of the virtual objects based on an environmental condition of a temperature change or a given temperature, the expansion of contraction of the dimensions of the virtual object dependent on an identification of a material type associated with the virtual object and defined in the metadata of the virtual object.

Masks illustrating contours of the virtual objects of FIG. 5C are shown at FIG. 5D.

Exemplary Method of Generating a Synthetic Image

Reference is now made to FIG. 9, illustrating an exemplary method 900 of generating a synthetic image from a setup in virtual space of one or more virtual objects that are positioned in the virtual space following a simulated freefall, as described, e.g., in method 800. The method 900 may be performed by system 100, or any other system in accordance with the present teachings.

Certain additional conditions in the virtual space may be defined to further imitate a real-life image.

For instance, in some examples, light may be applied to the virtual objects and/or the synthetic image background. The lighting may be applied after the simulated freefall or before the simulated freefall.

In some embodiments, lighting with ray tracing may be applied to the synthetic image background and/or the one or more virtual objects at step 910.

In some instances, a static light may be applied over one or more of the one or more virtual objects at step 920. The static light may be direct, distributed, or diffuse. Different lighting intensities may be applied.

Shadows corresponding to the selected lighting, calculated from the position of the one or more virtual objects and/or one or more background virtual objects of the synthetic image background, may be rendered through light tracing and the position(s) (e.g. defined by coordinates in the virtual space) of the one or more virtual objects and/or one or more background virtual objects of the synthetic image background.

In some instances, a view for taking the synthetic image may be set at step 930. In some examples, the synthetic image may be taken from a virtual camera object positioned in the virtual space, marking a reference point (0, 0, 0) for generating the synthetic image. A pan, tilt and/or zoom of the virtual camera object may be defined to adjust a field of view of the virtual object camera. In some examples, each virtual space may include a default position of the virtual camera object (e.g. having a top-down view of the virtual space, located at a center of the xy parallelogram defining the edges of the virtual space or synthetic image background).

A colour filter may also be applied to the virtual space.

The synthetic image is then generated at step 940, e.g., from the viewing angle of the virtual camera object. The resulting synthetic image includes the one or more virtual objects that have been positioned and remain visible following the simulated freefall, the synthetic image background, with the application, in some instances, of the lighting to the virtual objects and/or the synthetic image background.

The synthetic image may be generated with metadata corresponding to the synthetic image. The metadata of the synthetic image may be used for training an artificial intelligence model, to identify the location of virtual objects in the synthetic image and the identity of the objects in the synthetic image. The metadata may include coordinates that define an object mask corresponding to the location and dimensions of the virtual object in the synthetic image, as well as a label for each virtual object appearing in the synthetic image. The artificial intelligence model may parse the metadata to determine the identity of the virtual object appearing in the synthetic image or compare its output as to the location of the virtual object in the synthetic image with a location of the virtual object in the synthetic image as defined in the metadata of the synthetic image.

In some instances, each of the generated synthetic images may be paired with a corresponding masked image, where only contours of the visible one or more virtual objects are shown, and the synthetic image background is obscured in the masked image, at step 950.

Methods 700, 800 and 900, or 800 and 900, may be repeated to yield a plurality of synthetic images defining the dataset of synthetic images for training an artificial intelligence model for object recognition.

Different combinations of virtual objects, spawning at different positions, synthetic image backgrounds, with different lighting, may be selected to result in a varied dataset of synthetic images. As the setup (e.g. methods 700 and 800) for generating the layouts of the virtual spaces for yielding the synthetic images may be performed with no or little human intervention, large libraries of datasets of synthetic images may be generated from libraries of virtual object models and synthetic image backgrounds within times far shorter than when a human user had to manually position and label each object found in a synthetic image or real-world image.

Exemplary Dataset of Synthetic Images

Reference is now made to FIG. 6, representing a simplified illustration of a dataset of synthetic images 600.

The dataset 600 includes a plurality of synthetic images 350. The synthetic images 350 of the dataset 600 include different virtual objects with different synthetic image backgrounds. The number, type and/or position of the virtual objects found in the different synthetic images 350 of the dataset 600 may also vary.

Each of the synthetic images 350 of the dataset 600 may include metadata pertaining to, but not limited to:
- a value for the number of virtual objects appearing in the synthetic image 350;
- for each virtual object, a mask position and dimension (e.g. through two or more coordinates defining a parallelogram), corresponding to dimensions and position of the virtual object in the virtual image space;
- for each virtual object, a tag or label naming or identifying a type of the virtual object (e.g. a hammer, an incision knife, a catheter, scissors, etc.)
- a timestamp corresponding to when the synthetic image was generated, or when the synthetic image was last processed by the artificial intelligence model;
- a number for the synthetic image in the dataset 600 of synthetic images.

A dataset 600 of synthetic images may also include metadata on, but not limited to:
- a timestamp indicating when the dataset was generated, or when the dataset was last processed by the artificial intelligence model;
- a label or tag indicating a category of activity or field associated with the dataset (e.g. medical; pharmaceutical; automobile manufacturing; aerospace; industrial operations; environment; education; etc.)
- an integer representing the number of synthetic images composing the dataset;
- one or more permissions defining which remote computer(s) may access the dataset;
- a string of characters associated with the computer, user or application program that originated the dataset.

The dataset 600 of synthetic images may be stored in a non-transitory storage medium (such as a data source 110, memory 101, etc.) The dataset 600 of synthetic images may be stored in a library of datasets 600 of synthetic images, e.g. retrievable when needing to train an artificial intelligence model in performing a given task, such as object recognition for a given industry.

Exemplary Artificial Intelligence Model for Performing Object Recognition

The dataset of synthetic images may be provided to an artificial intelligence model to train the artificial intelligence model in performing object recognition in an image (e.g. a real image, an image stream, etc.).

The artificial intelligence model may be one as is known in the art for performing object recognition, such as one including a convolutional neural network for deep learning. The artificial intelligence model may be provided with a dataset of synthetic images that correspond to the type of the objects that the model will be instructed to recognize.

A machine learning model (e.g., neural network (NN) such as a convolutional neural network or a YOLO deep neural network architecture) can be trained by using a training dataset. Herein, the training can mean a process of determining weights and parameters of the neural network in order to achieve the object detection from the image input data. As a representative example of the parameter of the NN, there can be a weight given to a synapse or a bias applied to a neuron. Changing hyper-parameters and the neural network architecture can also be done during the training (convolutional neural network architecture can have multiple layers and kernels of various sizes, number of key points within a YOLO model can be varied, etc.) in order to optimize the object detection result.

Examples of unsupervised learning (a subcategory of machine learning models) include but are not limited to clustering and independent component analysis.

Examples of artificial neural networks using unsupervised learning include, but are not limited to, a generative adversarial network (GAN) and an autoencoder (AE), or a convolutional neural network (CNN), etc.

Examples of supervised learning (a subcategory of machine learning models) include Supervised Vector Machine and Regression Tree.

Examples of artificial neural networks using supervised learning include convolutional neural networks (CNNs), recurrent neural networks (RNNs) and Long short-term memory (LSTM).

An exemplary deep neural network is a convolution neural network.

Although the invention has been described with reference to preferred embodiments, it is to be understood that modifications may be resorted to as will be apparent to those skilled in the art. Such modifications and variations are to be considered within the purview and scope of the present invention.

Representative, non-limiting examples of the present invention were described above in detail with reference to the attached drawing. This detailed description is merely intended to teach a person of skill in the art further details for practicing preferred aspects of the present teachings and is not intended to limit the scope of the invention. Furthermore, each of the additional features and teachings disclosed above and below may be utilized separately or in conjunction with other features and teachings.

Moreover, combinations of features and steps disclosed in the above detailed description, as well as in the experimental examples, may not be necessary to practice the invention in the broadest sense, and are instead taught merely to particularly describe representative examples of the invention. Furthermore, various features of the above-described representative examples, as well as the various independent and dependent claims below, may be combined in ways that are not specifically and explicitly enumerated in order to provide additional useful embodiments of the present teachings.

What is claimed is:

1. A method of generating a dataset of synthetic images for training an artificial intelligence model for object recognition, comprising repeating, for generating each synthetic image of the dataset of synthetic images:

generating a virtual space including a synthetic image background comprising one or more synthetic surfaces;

spawning one or more virtual objects in the virtual space, wherein the spawning comprises:

spawning a plurality of virtual objects in a hidden mode in the virtual space through use of masks that are dimensioned to contain the virtual objects of the plurality of virtual objects, the masks concealing the plurality of virtual objects in the virtual space;

selecting the one or more virtual objects from the plurality of virtual objects; and revealing the one or more virtual objects for the simulation;

simulating a freefall of the one or more virtual objects resulting in a simulated impact between the one or more virtual objects and the one or more synthetic surfaces for determining a position of the one or more virtual objects on the synthetic image background; and generating the synthetic image composed of the synthetic image background and the one or more virtual objects with the position of the one or more virtual objects on the synthetic image background determined from the simulated impact.

2. The method as defined in claim 1, wherein the one or more virtual objects comprises one or more physical properties, and wherein the outcome of the simulated impact further accounts for the one or more physical properties of the one or more virtual objects.

3. The method as defined in claim 2, wherein the one or more physical properties of the one or more virtual objects comprises one or more of:

a type of object;

an object dimension;

an object material;

a center of mass of the object; and an object weight.

4. The method as defined in claim 1, wherein the plurality of virtual objects forms an object map.

5. The method as defined in claim 1, further comprising defining an object zone in the virtual space, where the one or more virtual objects are to be positioned in the object zone following the simulated impact.

6. The method as defined in claim 5, further comprising removing virtual objects of the one or more virtual objects that are outside of the object zone following the simulated impact or subsequent displacement from the surface of the object zone.

7. The method as defined in claim 5, wherein the spawning comprises offsetting the one or more virtual objects from the object zone such that the one or more virtual objects spawn over the object zone while the virtual objects of the one or more virtual objects are not in contact prior to the simulating.

8. The method as defined in claim 1, further comprising applying lighting with ray tracing to the one or more virtual objects and the synthetic object background.

9. The method as defined in claim 8, wherein the lighting is a first lighting, and further comprising applying a second static lighting above an area of the virtual space where the one or more virtual objects are spawned.

10. The method as defined in claim 1, wherein an initial orientation of each of the virtual objects of the one or more virtual objects is determined randomly prior to the simulating.

11. The method as defined in claim 1, wherein the generating of the synthetic image is taken at a viewing angle of a virtual camera object, wherein the position of the virtual camera object in the virtual space is determined randomly.

12. The method as defined in claim 1, further comprising generating a masked image corresponding to the synthetic image from which the coordinates of a rectangular box containing the object is registered.

13. The method as defined in claim 1, wherein the one or more synthetic surfaces each comprise a material texture having one or more physical properties and the simulated impact is generated as a function of at least the one or more physical properties of the one or more synthetic surfaces.

14. The method as defined in claim 1, further comprising simulating environmental conditions affecting the position or size of the one or more virtual objects.

15. A non-transitory storage medium having stored thereon a dataset of synthetic images for training an artificial intelligence model for object recognition generated by performing the method as defined in claim 1.

16. A method of training an artificial intelligence model for object recognition using the dataset of synthetic images as defined in claim 15, comprising:

receiving the dataset of synthetic images;

causing an identification and location of one or more virtual objects in a synthetic image of the dataset of synthetic images; and comparing the synthetic image with the one or more identified virtual objects to a ground truth to calculate a loss that is back-propagated through the artificial intelligence model to train the artificial intelligence model.

17. The method as defined in claim 1, wherein one or more of the following is varied to generate different synthetic images forming the dataset of synthetic images:

lighting with ray tracing to the one or more virtual objects and the synthetic object background;

a viewing angle of a virtual camera related to the perspective taken for the generated synthetic image;

the material texture of the one or more synthetic surfaces; and one or more types of the one or more virtual objects.

18. The method according to claim 1, wherein the plurality of objects forms an object map that occupies a part of the virtual space or a plane of the virtual space, occupying the virtual space in a hidden mode, wherein the object map is a constellation of the plurality of virtual objects, each virtual object of the plurality of virtual objects occupying a position in the virtual space defined in the x, y and z axes, each virtual object of the object map defined at a height (z) above the one or more synthetic surfaces.

19. A system configured to generate a dataset of synthetic images for training an artificial intelligence model for object recognition, comprising:

a processor;

memory further including program code that, when executed by the processor, causes the processor to repeat, for generating each synthetic image of the dataset of synthetic images:

generating a virtual space including a synthetic image background comprising one or more synthetic surfaces;

spawning one or more virtual objects in the virtual space, wherein the spawning comprises:

spawning a plurality of virtual objects in a hidden mode in the virtual space through use of masks that are dimensioned to contain the virtual objects of the plurality of virtual objects, the masks concealing the plurality of virtual objects in the virtual space;

selecting the one or more virtual objects from the plurality of virtual objects; and revealing the one or more virtual objects for the simulation;

simulating a freefall of the one or more virtual objects resulting in a simulated impact between the one or more virtual objects and the one or more synthetic surfaces for determining a position the one or more virtual objects on the synthetic image background; and generating the synthetic image composed of the synthetic image background and the one or more virtual objects with the position of the one or more virtual objects on the synthetic image background determined from the simulated impact.

20. A non-transitory computer-readable medium having stored thereon program instructions for generating a dataset of synthetic images for training an artificial intelligence model for object recognition training an artificial intelligence model for object recognition, the program instructions executable by a processing unit for repeating, for generating each synthetic image of the dataset of synthetic images:

generating a virtual space including a synthetic image background comprising one or more synthetic surfaces;

spawning one or more virtual objects in the virtual space, wherein the spawning comprises:

spawning a plurality of virtual objects in a hidden mode in the virtual space through use of masks that are dimensioned to contain the virtual objects of the plurality of virtual objects, the masks concealing the plurality of virtual objects in the virtual space;

selecting the one or more virtual objects from the plurality of virtual objects; and revealing the one or more virtual objects for the simulation;

simulating a freefall of the one or more virtual objects resulting in a simulated impact between the one or more virtual objects and the one or more synthetic surfaces (including environmental simulation effects) for determining a position the one or more virtual objects on the synthetic image background; and generating the synthetic image composed of the synthetic image background and the one or more virtual objects with the position of the one or more virtual objects on the synthetic image background determined from the simulated impact and environmental condition simulation.

* * * * *